(12) United States Patent
Klenner et al.

(10) Patent No.: US 11,916,665 B2
(45) Date of Patent: *Feb. 27, 2024

(54) COMMUNICATION METHOD AND COMMUNICATION DEVICE

(71) Applicant: Panasonic Holdings Corporation, Osaka (JP)

(72) Inventors: Peter Klenner, Frankfurt (DE); Frank Herrmann, Frankfurt (DE); Tomohiro Kimura, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/743,783

(22) Filed: May 13, 2022

(65) Prior Publication Data

US 2022/0278770 A1 Sep. 1, 2022

Related U.S. Application Data

(63) Continuation of application No. 17/194,661, filed on Mar. 8, 2021, now Pat. No. 11,362,761, which is a
(Continued)

(30) Foreign Application Priority Data

May 22, 2014 (EP) ..................... 14169535
Apr. 27, 2015 (JP) ................. 2015-090218

(51) Int. Cl.
*H04L 1/00* (2006.01)
*H03M 13/11* (2006.01)
(Continued)

(52) U.S. Cl.
CPC ......... *H04L 1/0041* (2013.01); *H03M 13/116* (2013.01); *H03M 13/1165* (2013.01);
(Continued)

(58) Field of Classification Search
CPC ... H04L 1/0041; H04L 1/0058; H04L 1/0071; H04L 27/3405; H04L 27/34;
(Continued)

(56) References Cited

U.S. PATENT DOCUMENTS 10,355,816 B2 * 7/2019 Klenner ............. H03M 13/1165
10,979,173 B2 * 4/2021 Klenner ............. H03M 13/1165
(Continued)

FOREIGN PATENT DOCUMENTS

EP 2 552 043 1/2013
EP 2 560 310 2/2013
(Continued)

OTHER PUBLICATIONS

International Search Report of PCT application No. PCT/JP2015/002504 dated Aug. 4, 2015.
Belkacem Mouhouche et al., "High Order Non-Uniform Constellations for broadcasting UHDTV", 2014 IEEE, pp. 600-605.
DVB-S2 : ETSI EN 302 307 V1.2.1, Aug. 2009.
(Continued)

*Primary Examiner* — Thien Nguyen
(74) *Attorney, Agent, or Firm* — Wenderoth, Lind & Ponack, L.L.P.

(57) ABSTRACT

A communication method includes executing a cyclic block permutation for a codeword generated based on a quasi-cyclic parity-check code including a repeat-accumulate quasi-cyclic low-density parity-check code, where the cyclic block permutation is permutation of cyclic blocks within the codeword, and mapping each bit of the codeword for which the cyclic block permutation is executed to any one of constellation point of a non-uniform constellation.

5 Claims, 17 Drawing Sheets

Related U.S. Application Data continuation of application No. 16/427,762, filed on May 31, 2019, now Pat. No. 10,979,173, which is a continuation of application No. 15/271,203, filed on Sep. 20, 2016, now Pat. No. 10,355,816, which is a continuation of application No. PCT/JP2015/002504, filed on May 19, 2015.

(51) Int. Cl.
*H03M 13/25* (2006.01)
*H03M 13/27* (2006.01)
*H04L 27/34* (2006.01)

(52) U.S. Cl.
CPC ..... *H03M 13/255* (2013.01); *H03M 13/2778* (2013.01); *H04L 1/0058* (2013.01); *H04L 1/0071* (2013.01); *H04L 27/3405* (2013.01)

(58) Field of Classification Search
CPC .............. H04L 1/0057; H03M 13/116; H03M 13/1165; H03M 13/255; H03M 13/2778; H03M 13/19
See application file for complete search history.

(56) References Cited

U.S. PATENT DOCUMENTS

| | | | |
|---|---|---|---|
| 11,362,761 B2* | 6/2022 | Klenner | H04L 27/3405 |
| 2011/0090948 A1 | 4/2011 | Zhou et al. | |
| 2013/0216001 A1 | 8/2013 | Petrov | |
| 2016/0261288 A1 | 9/2016 | Shinohara | |

FOREIGN PATENT DOCUMENTS

| | | |
|---|---|---|
| EP | 2 690 790 | 1/2014 |
| JP | 2011-523318 | 8/2011 |
| WO | 2013/014906 | 1/2013 |
| WO | 2013/024584 | 2/2013 |

OTHER PUBLICATIONS

Extended European Search Report dated May 11, 2017 in corresponding European Application No. 15796489.1.
Draft ETSI EN 303105 V1.1.1, Digital Video Broadcasting (DVB); Next Generation broadcasting system to Handheld, physical layer specification (DVB-NGH), Jun. 3, 2013 (Jun. 3, 2013), XP017840591.

* cited by examiner

FIG. 4

| QB | CHECK-NODE INDICES FOR THE FIRST BIT IN EACH CYCLIC BLOCK QB | | | | |
|---|---|---|---|---|---|
| 1  | 13 | 24 | 27 | 31 | 47 |
| 2  | 4  | 7  | 8  | 22 | 43 |
| 3  | 2  | 15 | 20 | 33 | 35 |
| 4  | 3  | 26 | 29 |    |    |
| 5  | 12 | 20 | 22 |    |    |
| 6  | 11 | 22 | 30 |    |    |
| 7  | 15 | 24 | 38 |    |    |
| 8  | 13 | 28 | 47 |    |    |
| 9  | 31 | 42 | 44 |    |    |
| 10 | 5  | 21 | 39 |    |    |
| 11 | 16 | 28 | 30 |    |    |
| 12 | 6  | 19 | 23 |    |    |

FIG. 12A

| | | | | | | | |
|---|---|---|---|---|---|---|---|
| QB1 | $b_{1,Re}$ | $b_{1,Im}$ | | | | | |
| QB2 | $b_{2,Re}$ | $b_{2,Im}$ | | | | | |
| QB3 | $b_{3,Re}$ | $b_{3,Im}$ | | | | | |
| QB4 | $b_{4,Re}$ | $b_{4,Im}$ | | | | | |
| QB5 | $b_{5,Re}$ | $b_{5,Im}$ | | | | | |
| QB6 | $b_{6,Re}$ | $b_{6,Im}$ | | | | | |
| QB7 | | | | | | | |
| QB8 | | | | | | | |
| QB9 | | | | | | | |
| QB10 | | | | | | | |
| QB11 | | | | | | | |
| QB12 | | | | | | | |
| QB13 | | | | | | | |
| QB14 | | | | | | | |
| QB15 | | | | | | | |
| QB16 | | | | | | | |
| QB17 | | | | | | | |
| QB18 | | | | | | | |
| QB19 | | | | | | | |
| QB20 | | | | | | | |
| QB21 | | | | | | | |
| QB22 | | | | | | | |
| QB23 | | | | | | | |
| QB24 | | | | | | | |

QB1–QB6: SECTION 1
QB7–QB12: SECTION 2
QB13–QB18: SECTION 3
QB19–QB24: SECTION 4

FIG. 13A

| | | | | | | | | |
|---|---|---|---|---|---|---|---|---|
| QB1 | $b_0$ | | | | | | | |
| QB2 | $b_1$ | | | | | | | |
| QB3 | $b_2$ | | | | | | | |
| QB4 | $b_3$ | | | | | | | |
| QB5 | $b_4$ | | | | | | | |
| QB6 | $b_5$ | | | | | | | ⎫ |
| QB7 | $b_6$ | | | | | | | ⎬ SECTION 1 |
| QB8 | $b_7$ | | | | | | | ⎭ |
| QB9 | $b_8$ | | | | | | | |
| QB10 | $b_9$ | | | | | | | |
| QB11 | $b_{10}$ | | | | | | | |
| QB12 | $b_{11}$ | | | | | | | |
| QB13 | | | | | | | | |
| QB14 | | | | | | | | |
| QB15 | | | | | | | | |
| QB16 | | | | | | | | |
| QB17 | | | | | | | | |
| QB18 | | | | | | | | ⎬ SECTION 2 |
| QB19 | | | | | | | | |
| QB20 | | | | | | | | |
| QB21 | | | | | | | | |
| QB22 | | | | | | | | |
| QB23 | | | | | | | | |
| QB24 | | | | | | | | |

COMMUNICATION METHOD AND COMMUNICATION DEVICE

BACKGROUND

1. Technical Field

The present disclosure relates to a digital communication field. More specifically, the present disclosure relates to bit interleavers and bit de-interleavers in a bit-interleaved coding and modulation (BICM) system using quasi-cyclic low-density parity-check codes (QC LDPC codes) and quadrature amplitude modulation (QAM).

2. Description of the Related Art

In these years, a lot of transmitters are proposed, and in the transmitters, bit interleavers are disposed between encoders that encode information bits and output codeword bits, and constellation mappers that map the codeword bits to constellations and that output modulation symbols (for example, refer to PTL1).

CITATION LIST

Patent Literature
PTL 1: EP 11006087.8
Non-Patent Literature
NPL 1: DVB-S2 standard: ETSI EN 302 307, V1.2.1 (August, 2009)

SUMMARY

In one general aspect, the techniques disclosed here feature a communication method including executing a cyclic block permutation for a codeword generated based on a quasi-cyclic low-density parity-check code including a repeat-accumulate quasi-cyclic low-density parity-check code, where the codeword includes a sequence of N cyclic blocks, each of the N cyclic blocks includes Q bits, each of N and Q is a positive integer, and the cyclic block permutation is permutation of the cyclic blocks within the codeword, mapping each of the bits of the codeword for which the cyclic block permutation is executed to any one of constellation points of a non-uniform constellation, and transmitting the mapped codeword. In the communication method, the cyclic block permutation and the non-uniform constellation are selected based on a code rate of the quasi-cyclic low-density parity-check code used for generation of the codeword, in a case where the code rate of the quasi-cyclic low-density parity-check code is equal to 7/15, the cyclic block permutation is defined according to Table 3.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 4 is a diagram illustrating one example of a table that defines repeat-accumulate quasi-cyclic low-density parity-check codes;

FIG. 12A is a diagram for illustrating one example of the BICM encoder of FIG. 2 based on DVB-NGH;
FIG. 13A is a diagram for illustrating one example of the BICM encoder of FIG. 2 based on ATSC 3.0.

DETAILED DESCRIPTION

<<Items Confirmed Until the Inventors have Achieved the Present Disclosure>>

Figure 1:
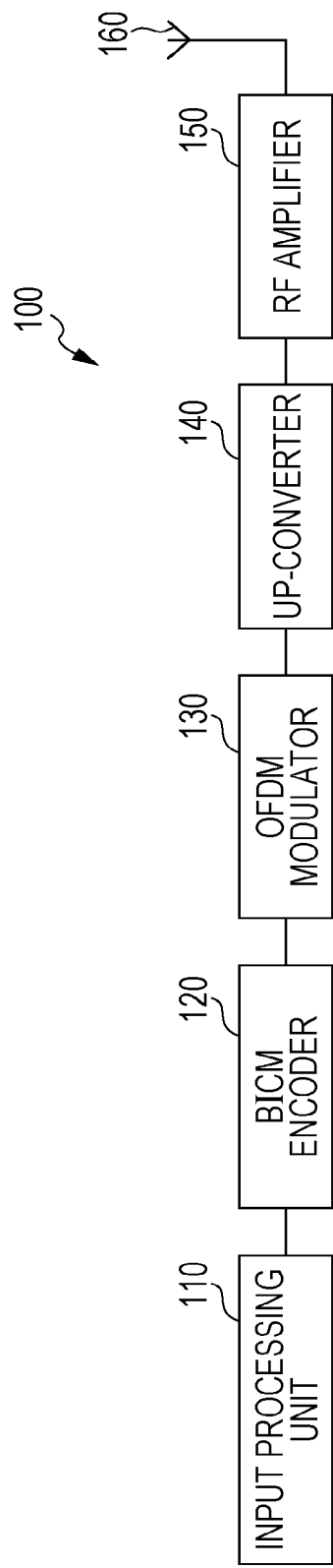
FIG. 1 is a block diagram illustrating one configuration example of a transmitter including general bit-interleaved coding and modulation (BICM)

FIG. 1 is a block diagram illustrating one configuration example of a transmitter including general bit-interleaved coding and modulation (BICM).

Transmitter 100 illustrated in FIG. 1 includes input processing unit 110, BICM encoder 120, orthogonal frequency-division multiplexing (OFDM) modulator 130, up-converter 140, radio frequency (RF) amplifier 150, and antenna 160.

Input processing unit 110 formats input-bit-streams into blocks of a determined length called baseband frames. BICM encoder 120 converts the baseband frames into data-streams including a plurality of complex values. OFDM modulator 130 uses, for example, OFDM modulation, and typically performs time interleaving and frequency interleaving for improving diversity. Up-converter 140 converts digital baseband signals into analog RF signals. RF amplifier 150 performs power amplification of the analog RF signals, and outputs the analog RF signals to antenna 160.

Figure 2:
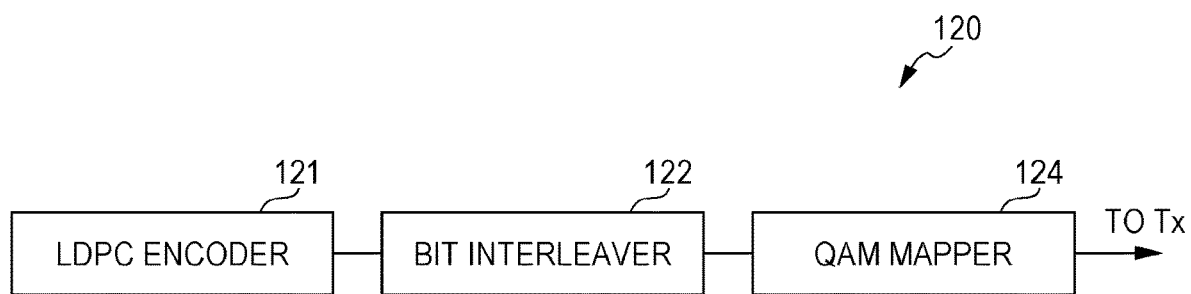
FIG. 2 is a block diagram illustrating one configuration example of a BICM encoder of FIG. 1.

FIG. 2 is a block diagram illustrating one configuration example of BICM encoder 120 of FIG. 1.

BICM encoder 120 illustrated in FIG. 2 includes low-density parity-check (LDPC) encoder 121, bit interleaver 122, and quadrature amplitude modulation (QAM) mapper 124.

LDPC encoder 121 encodes input blocks, that is, the baseband frames, and outputs LDPC codewords to bit interleaver 122. Bit interleaver 122 permutates bits of each LDPC codeword, and then QAM mapper 124 maps the bits of each LDPC codeword to complex cells. QAM mapper 124 maps the permutated bits of each LDPC codeword to the complex cells by using QAM.

Each component of BICM encoder 120 in FIG. 2 will be described in more detail below.

First, LDPC encoder 121 will be described.

LDPC encoder 121 encodes the baseband frames by using a specific LDPC code. The present disclosure is particularly designed for LDPC block codes having staircase parity structure which is employed in the DVB-S2, DVB-T2, DVB-C2 standards, and for variations of Raptor-like LDPC codes. More details will be described below.

The LDPC block code is a linear error-correcting code that is fully defined by its parity-check matrix (PCM). This PCM is a binary sparse matrix representing connection of the codeword bits (also referred to as bit nodes or variable nodes) to parity checks (also referred to as check nodes). Columns and rows of the PCM correspond to the variable nodes and check nodes, respectively. Connection of the variable nodes to the check nodes are represented by "1" entries in the PCM matrix.

Quasi-cyclic low-density parity-check (QC LDPC) codes have structure especially suitable for hardware implementation. In fact, most if not all standards today use the QC LDPC codes. The PCM of such a QC LDPC code has special structure having cyclic matrices (or also referred to as cyclic). The cyclic matrix is a square matrix in which each row is a cyclic shift of a previous row by one matrix element, and may have one or more folded diagonals.

A size of each cyclic matrix is Q×Q (Q rows and Q columns), and Q is referred to as a cyclic factor of the QC LDPC code. This quasi-cyclic structure makes it possible to process Q check nodes in parallel. Therefore, the quasi-cyclic structure is clearly advantageous for efficient hardware implementation.

The PCM of a QC LDPC code is a matrix having Q×M rows and Q×N columns, and the codewords each include N blocks including Q bits. In addition, M is a number of blocks in a parity part. Note that a Q-bit block is referred to as a quasi-cyclic block or simply a cyclic block throughout this document, and is abbreviated as QB.

Figure 3:
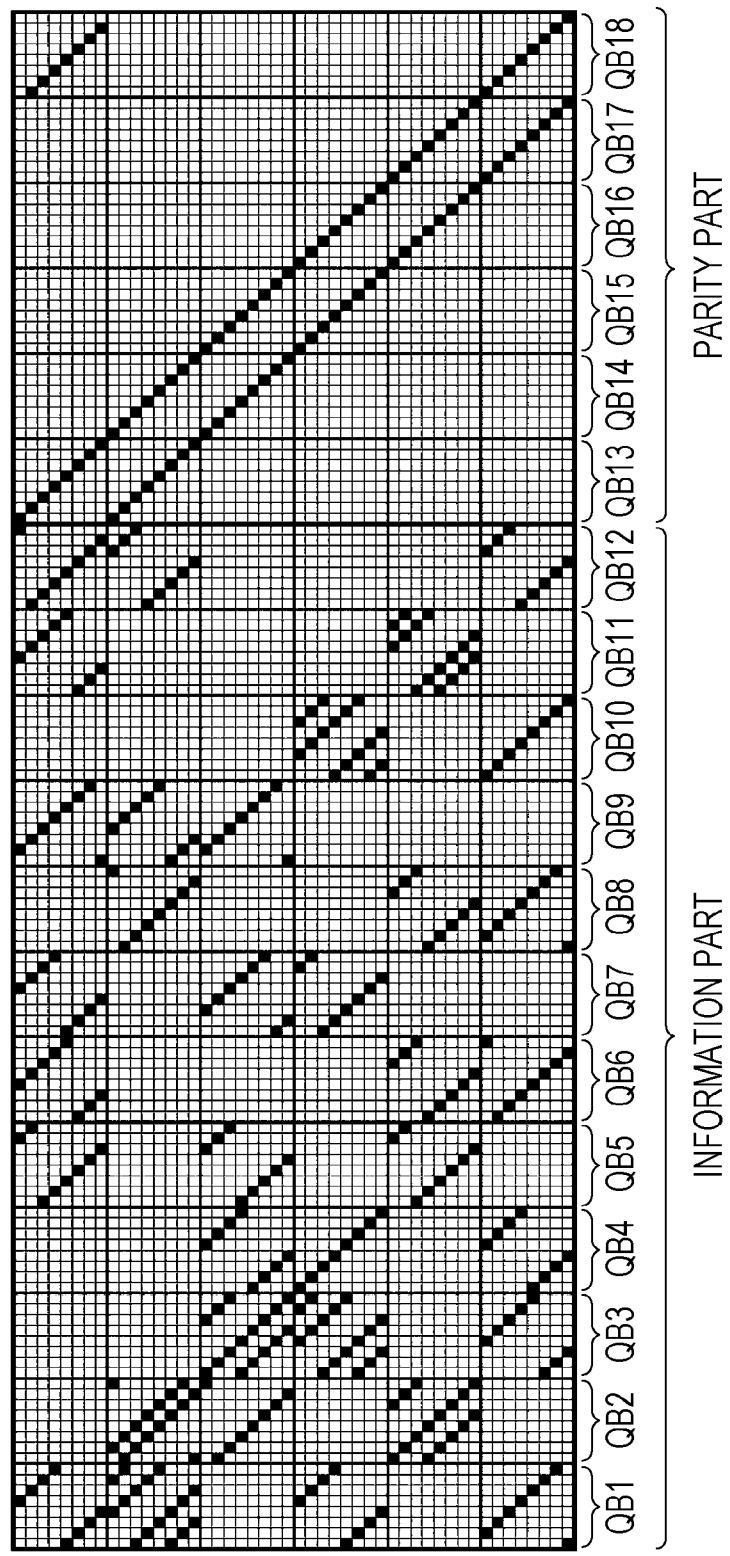
FIG. 3 is a diagram illustrating one example of a parity-check matrix of a quasi-cyclic low-density parity-check code with M=6, N=18, Q=8.

FIG. 3 is a diagram illustrating one example of the PCM of the QC LDPC code with M=6, N=18, Q=8. The PCM includes cyclic matrices having one or two folded diagonals. This QC LDPC code encodes a block of 8×12=96 bits to a codeword of 8×18=144 bits, and thus a code rate is 2/3. Note that in FIG. 3, FIG. 5 to FIG. 7, a black square is a matrix element of a value "1," and a white square is a matrix element of a value "0."

The QC LDPC code with the PCM illustrated in FIG. 3 belongs to a special family of QC LDPC codes referred to as repeat-accumulate quasi-cyclic low-density parity-check (RA QC LDPC) codes. The RA QC LDPC codes are known for ease of encoding, and are employed in a very large number of standards such as the second generation DVB standards (DVB-S2, DVB-T2, DVB-C2).

Next, the following describes definition of the RA QC LDPC codes used in the standard family of DVB-S2, DVB-T2, DVB-C2, as described in Section 5.3.2 and Appendixes B and C of NPL1 of the DVB-S2 standard (DVB-S2 standard: ETSI EN 302 307: V1.2.1 (August, 2009)). In this standard family, cyclic factor Q is equal to 360.

Each LDPC code is fully defined by a table containing, for a first bit of each cyclic block in an information part, indices of each check node to which the first bit is connected. Note that the indices of each check node start with zero. These indices are referred to as "addresses of the parity bit accumulators" in the DVB-S2 standard. FIG. 4 illustrates the table for the LDPC code one example of which is illustrated in FIG. 3.

Figure 5:
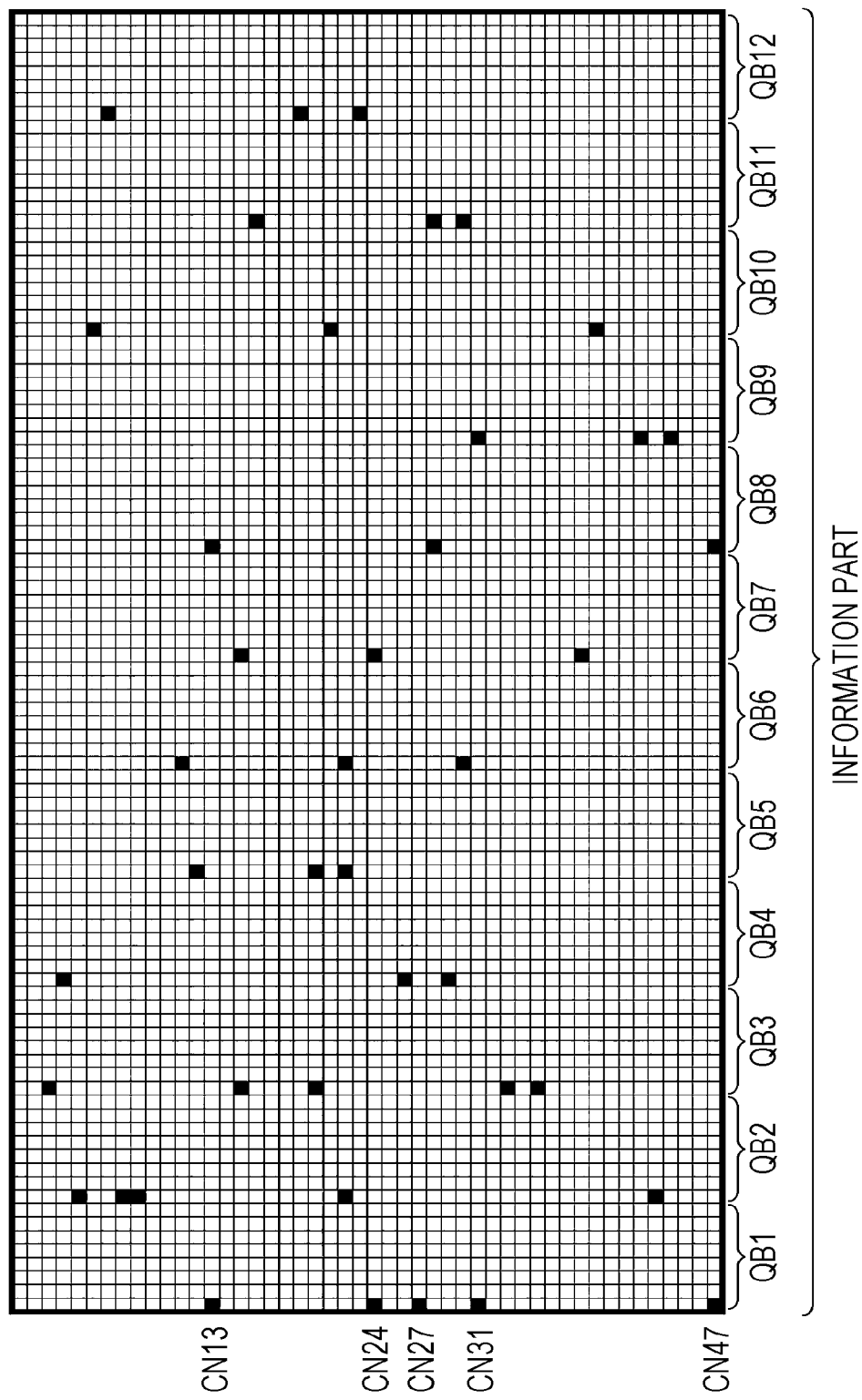
FIG. 5 is a diagram illustrating an information part of the parity-check matrix for a first bit in each cyclic block of the information part for the repeat-accumulate quasi-cyclic low-density parity-check codes of FIG. 4.

FIG. 5 is a diagram illustrating the information part of the PCM for a first bit in each cyclic block of the information part for the RA QC LDPC code of FIG. 4.

Figure 6:
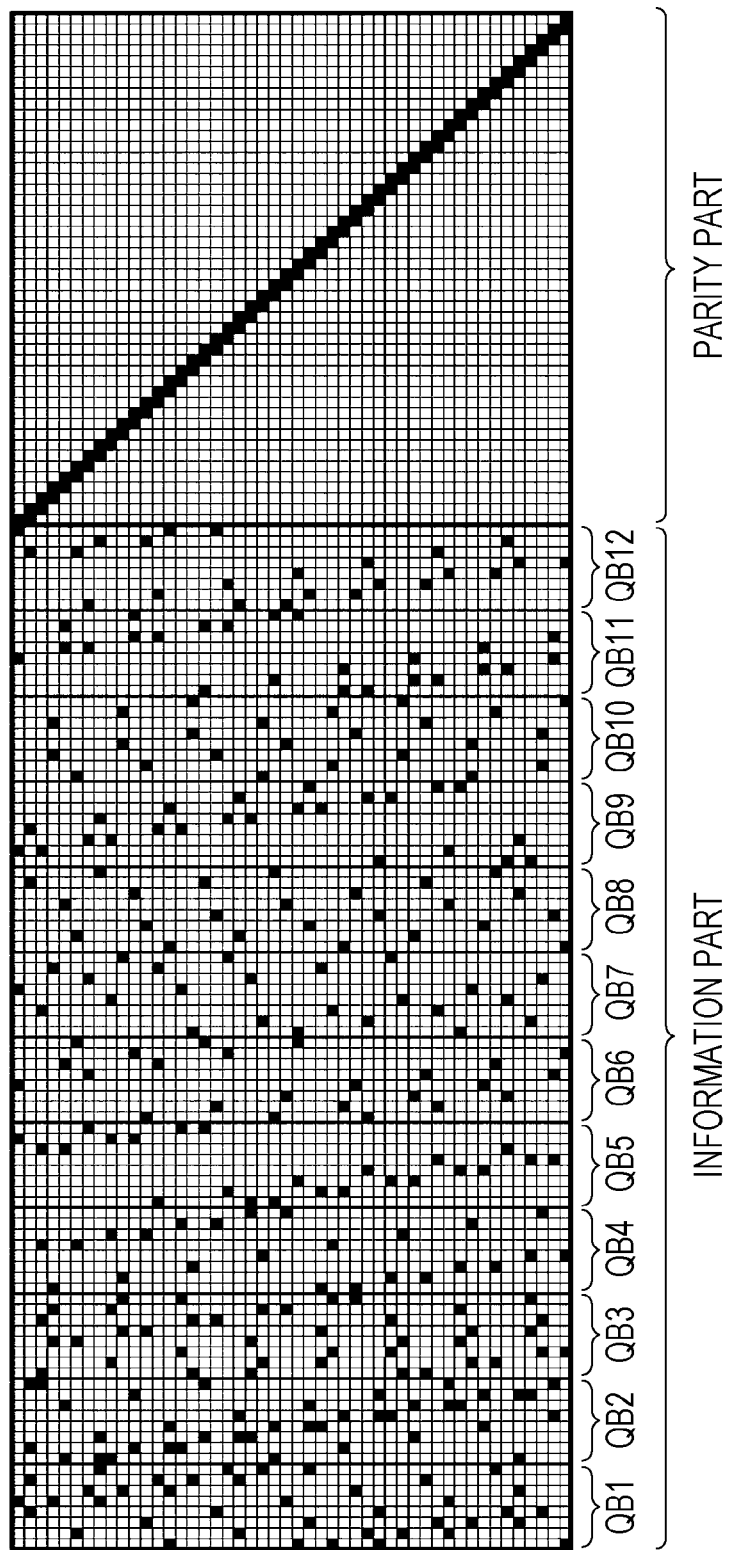
FIG. 6 is a diagram illustrating a full parity-check matrix including entries for all information bits and a staircase parity part for the parity-check matrix of FIG. 5.

The full PCM includes entries for all information bits and the staircase parity part, and is illustrated in FIG. 6.

For each bit other than the first bit of each cyclic block in the information part, the indices of each check node to which the bit is connected are calculated by Equation 1 described below.

$$i_q = (i_0 + q \times M) \% (Q \times M) \qquad \text{[Equation 1]}$$

where q is a bit index (0, . . . , Q−1) within one cyclic block, $i_q$ is a check node index for bit q, and $i_0$ is one of the check nodes to which the first bit of the cyclic block in the table of FIG. 4 is connected. M is a number of cyclic blocks in the parity part, and is 6 in the example of FIG. 6, and Q is a number of bits of one cyclic block and is 8 in the example of FIG. 6. Q×M is a number of parity bits, and is 8×6=48 in the example of FIG. 6. % is a modulo operator. Note that for example, for the cyclic block QB of "1," calculation by Equation 1 described above is performed on each of $i_0$=13, 24, 27, 31, 47 in the case of FIG. 4.

Figure 7:
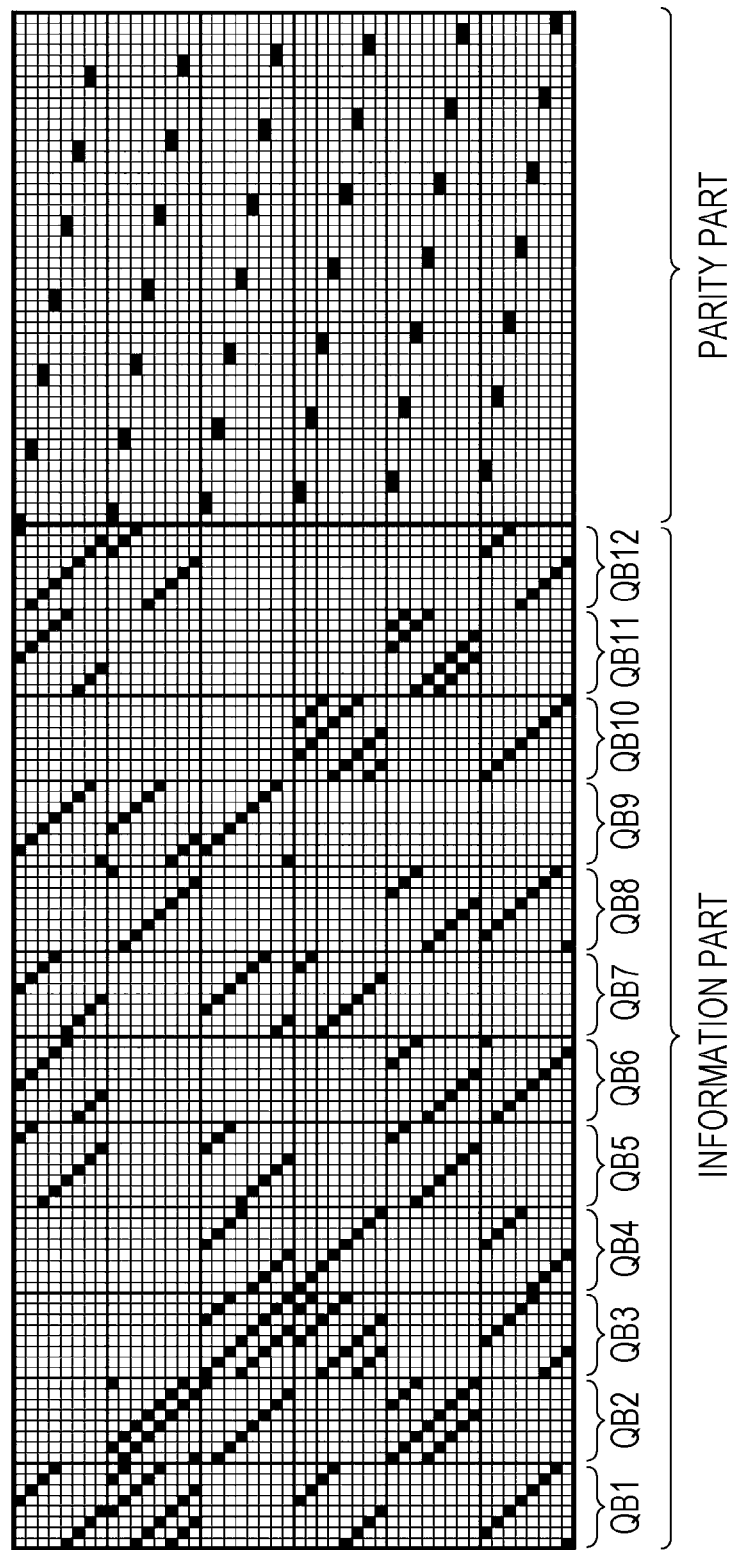
FIG. 7 is a diagram illustrating a matrix representing quasi-cyclic structure of the parity-check matrix of FIG. 6.

In order to represent the quasi-cyclic structure of the PCM in FIG. 6, a permutation expressed by Equation 2 described below is applied to the rows of the PCM in FIG. 6, and this application of the permutation results in the matrix illustrated in FIG. 7.

$$j = (i \% M) \times Q + \text{floor}(i/M) \qquad \text{[Equation 2]}$$

where i and j are indices starting with zero. i is an index of the check nodes before permutation, and j is an index of the check nodes after permutation. M is a number of cyclic blocks in the parity part, and is 6 in the example of FIG. 6, and Q is a number of bits of one cyclic block, and is 8 in the example of FIG. 6. % is a modulo operator, and floor(x) is a function that outputs a maximum integer equal to or less than X.

Since this permutation by Equation 2 is not applied to the bits, code definition is not changed. However, the parity part of the PCM resulting from this permutation by Equation 2 is not quasi-cyclic. In order to make the parity part quasi-cyclic, a special permutation expressed by Equation 3 described below is applied to the parity bits.

$$j = (i \% Q) \times M + \text{floor}(i/Q) \qquad \text{[Equation 3]}$$

where i and j are indices starting with zero, i is an index of the parity bits before permutation, and j is an index of the parity bits after permutation. M is a number of cyclic blocks in the parity part, and is 6 in the example of FIG. 7, and Q is a number of bits of one cyclic block, and is 8 in the example of FIG. 7. % is a modulo operator, and floor(x) is a function that outputs a maximum integer equal to or less than x.

This permutation by Equation 3 applied to the parity bits changes the code definition.

Note that the permutation by Equation 3 applied to the parity bits is referred to as a parity permutation or parity interleaving throughout this document. However, the parity permutation or the parity interleaving will be regarded as part of the LDPC encoding process hereinafter.

The next-generation ATSC 3.0 standard for terrestrial reception of digital video service is currently under development, and will define 1/15, 2/15, . . . , 13/15 as code rates, and 16200 code bits and 64800 code bits as code lengths.

Next, QAM mapper 124 will be described.

Figure 8A:
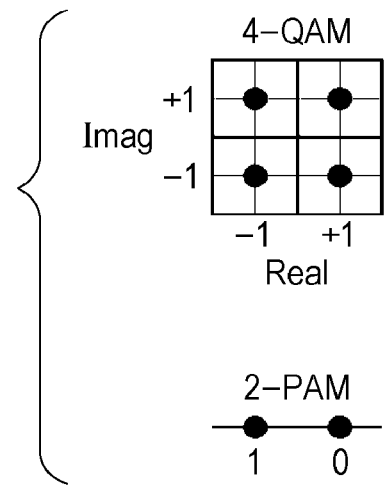
FIG. 8A is a diagram illustrating a 4-QAM constellation.
Figure 8B:
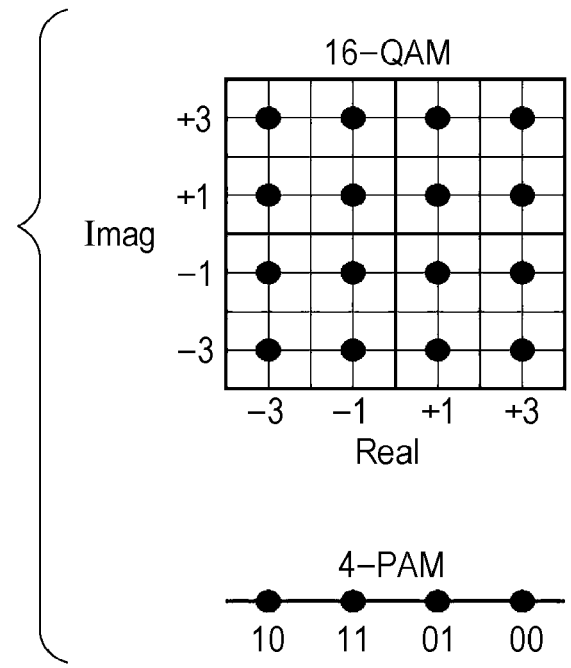
FIG. 8B is a diagram illustrating a 16-QAM constellation.
Figure 8C:
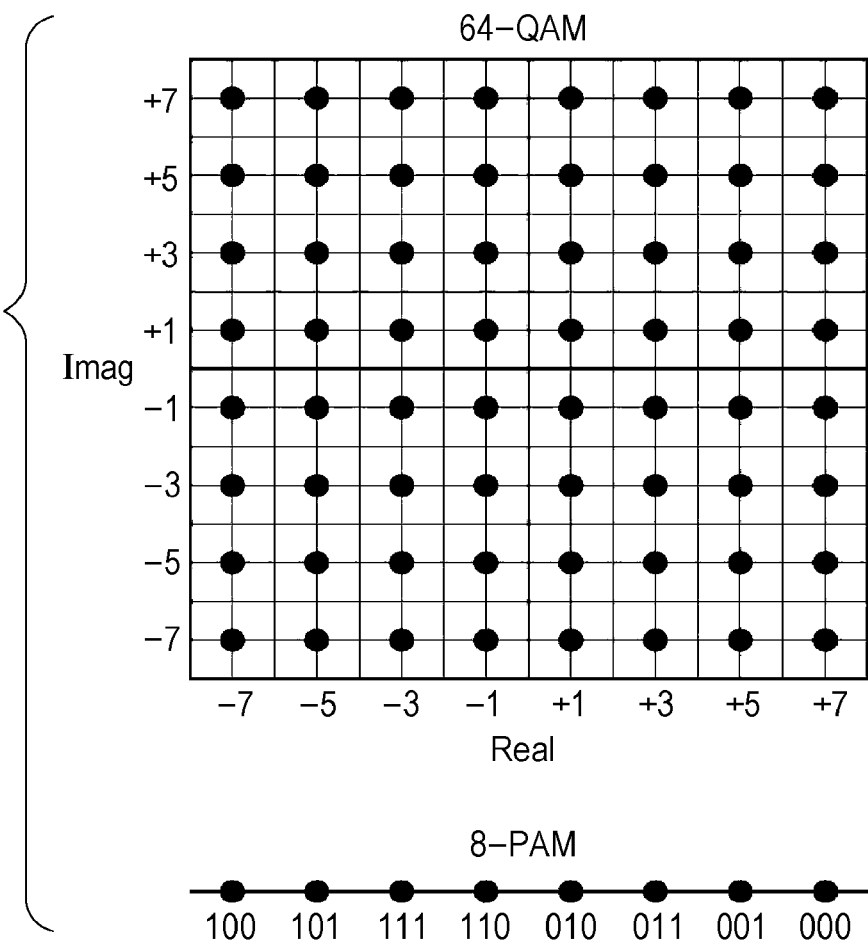
FIG. 8C is a diagram illustrating a 64-QAM constellation.

QAM mapper 124 maps the bit of the codeword to one point of a plurality of points in a QAM constellation by independently modulating real components and imaginary components by using pulse-amplitude modulation (PAM). Each point in the QAM constellation corresponds to one combination of the bits. FIG. 8A to FIG. 8C are diagrams illustrating three types of QAM constellations relevant to the present disclosure, a 4-QAM constellation, a 16-QAM constellation, and a 64-QAM constellation.

Here, the real components and the imaginary components use the same type of PAM. The real components and the imaginary components use 2-PAM, 4-PAM, 8-PAM in the 4-QAM constellation, the 16-QAM constellation, and the 64-QAM constellation, respectively.

The present disclosure also assumes that the PAM mapping uses Gray encoding, as illustrated from FIG. 8A to FIG. 8C.

Figure 9A:
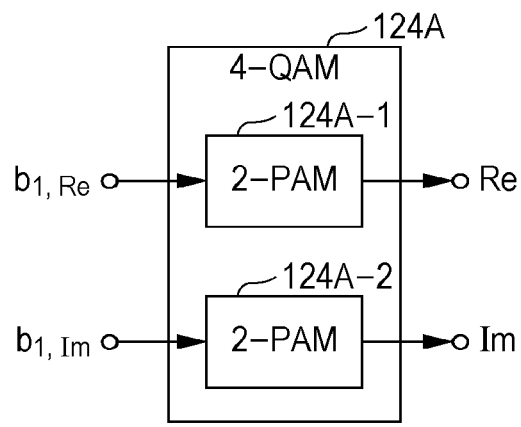
FIG. 9A is a block diagram illustrating configuration of a 4-QAM mapper.
Figure 9B:
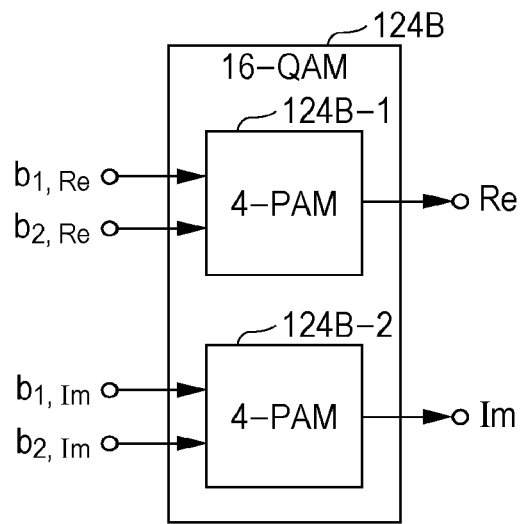
FIG. 9B is a block diagram illustrating configuration of a 16-QAM mapper.
Figure 9C:
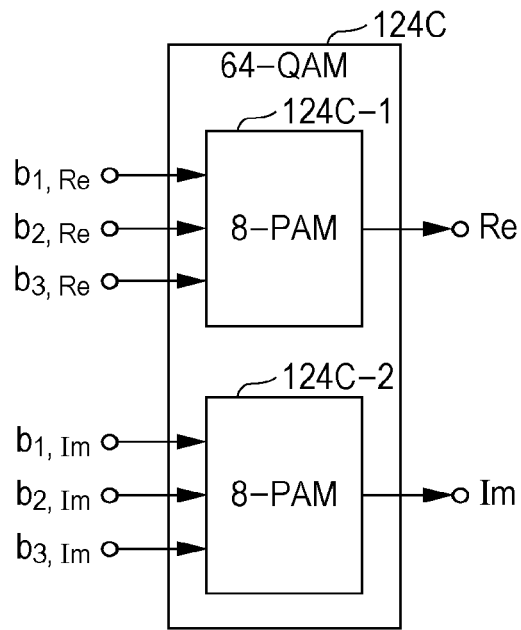
FIG. 9C is a block diagram illustrating configuration of a 64-QAM mapper.

FIG. 9A, FIG. 9B, FIG. 9C are blocks illustrating configurations of the QAM mappers corresponding to the constellations of FIG. 8A, FIG. 8B, FIG. 8C, respectively. 4-QAM mapper 124A of FIG. 9A includes two independent 2-PAM mappers 124A-1, 124A-2 each of which encodes one bit. 16-QAM mapper 124B of FIG. 9B includes two independent 4-PAM mappers 124B-1, 124B-2 each of which encodes two bits. 64-QAM mapper 124C of FIG. 9C includes two independent 8-PAM mappers 124C-1, 124C-2 each of which encodes three bits.

Figure 10:
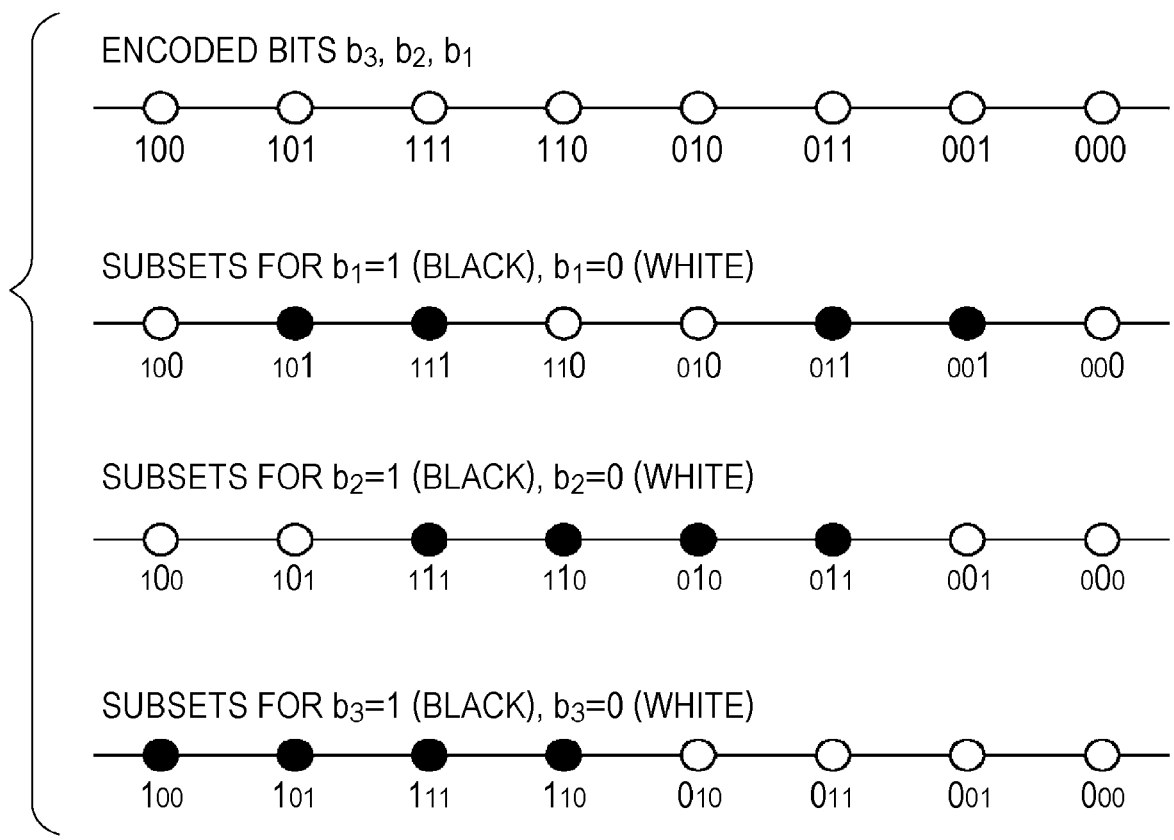
FIG. 10 is a schematic view for illustrating different robustness levels in an 8-PAM symbol using Gray encoding.

The bits encoded in a PAM symbol have different robustness levels, in other words, different reliability when the PAM symbol received in a receiver is demapped. This is a well known fact, and FIG. 10 illustrates a schematic view for illustrating the different robustness levels in an 8-PAM symbol using Gray encoding.

The different robustness levels result from a fact that a distance between a portion with a bit value of zero and a portion with a bit value of one is different for each of three bits $b_1$, $b_2$, $b_3$. The reliability of a bit is proportional to an average distance between the portion with a bit value of zero and the portion with a bit value of one. In the example illustrated in FIG. 10, bit $b_1$ has lowest reliability, bit $b_2$ has second lowest reliability, and bit $b_3$ has highest reliability.

In order to increase a transmission rate of bits, that is, BICM capacity, non-uniform constellations have been introduced in the DVB-NGH standard, which is the first time. This increase is achieved by changing an interval between PAM constellation points, and so-called 1D-NU-PAMs are obtained. Next, a square non-uniform constellation is obtained from the 1D-NU-PAMs.

Figure 11:
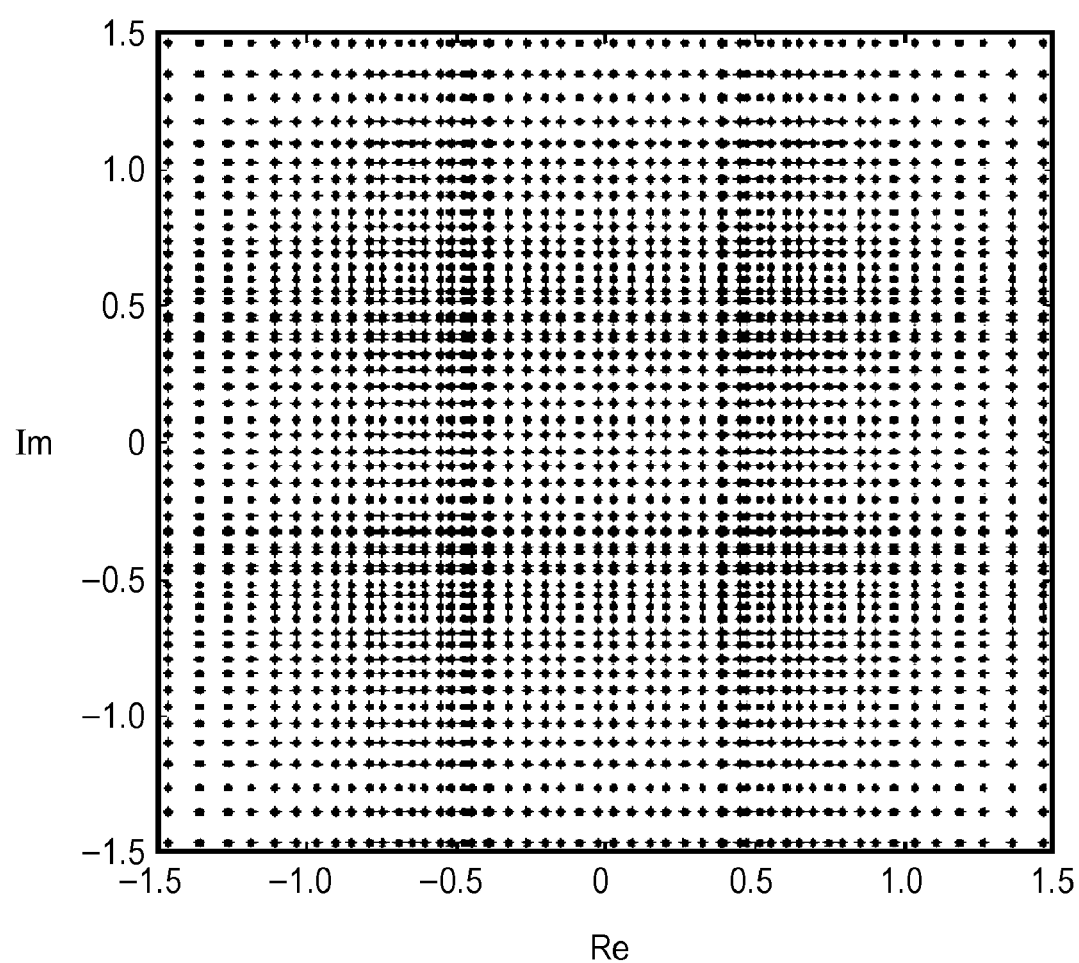
FIG. 11 is a diagram illustrating one example of a 4096-QAM constellation based on 1 D-64 NU-PAM designed for a specific SNR.

In ATSC 3.0, this idea is further improved by introducing two-dimensional non-uniform constellations, so-called 2D-NUCs. The 2D-NUCs involve increased demapping complexity at the receiver because An in-phase (I)-component and a quadrature (Q)-component of the received complex cells are dependent on each other. Higher demapping complexity is considered acceptable in ATSC 3.0 up to a constellation order of 1024. Moreover, constellations based on PAM for 4096-QAM constellations are determined to be allowed. FIG. 11 illustrates one example of a 4096-QAM constellation based on 1D-64 NU-PAM.

A number of bits in the QAM symbol is represented by B. Since the QAM constellations are square, B is an even number. Further, since a square QAM symbol includes two PAM symbols of the same type, the bits encoded in the QAM symbol can be grouped into pairs having the same robustness levels. The bits encoded in the QAM symbol are referred to as a constellation word.

Next, bit interleaver 122 will be described.

Typically, the bits of an LDPC codeword have different importance levels, and the bits of a constellation have different robustness levels. Direct, that is, non-interleaved mapping of the LDPC codeword bits to the QAM constellation bits does not achieve optimal performance. In order to prevent such performance reduction, the codeword bits need to be interleaved before the codeword bits are mapped to constellations.

For this purpose, bit interleaver 122 is provided between LDPC encoder 121 and QAM mapper 124, as illustrated in FIG. 2. Careful designing of bit interleaver 122 can achieve an optimal relationship between the bits of the LDPC codeword and the bits encoded by the constellation, and leads improved performance. Typically, evaluation criterion of the performance is a bit error rate (BER) or a frame error rate (FER) as a function of a signal-to-noise ratio (SNR).

The different importance levels of the bits of an LDPC codeword result firstly from a fact that a number of parity checks (check nodes) is different in some of the bits. The larger the number of the parity checks (check nodes) connected to a codeword bit (variable node) is, the more important the bit is in iterative LDPC decoding processing.

Further, the different importance levels of the bits of the LDPC codeword results secondly from a fact that the variable nodes have different connectivity to the cycles in the Tanner graph representation of the LDPC code. Thus, the importance levels of the bits may be different even when the number of the parity checks (check nodes) connected to the codeword bits of the LDPC codeword is the same number in each of the bits.

These ideas are well known in the art. As a general rule, the larger the number of the check nodes connected to a variable node is, the larger the importance level of the variable node is.

Particularly, in the case of QC LDPC codes, all bits included in a cyclic block of Q bits have the same importance level because the number of the parity checks (check nodes) connected to each of the bits is the same number, and connectivity to the cycles in the Tanner graph representation is the same.

Next, a method for mapping the bits of a QC LDPC codeword to constellation words will be described. This mapping is performed by bit interleaver 122 in FIG. 2. Note that this method for mapping is disclosed in PTL1 (EP11006087.8), which is incorporated herein by reference in its entirety. While PTL1 (EP11006087.8) relates to a case where a number of transmission antennas is any number T, the following describes a case relevant to the present disclosure, that is, a case where number of transmission antennas T is one.

According to PTL1 (EP11006087.8), the bits of a QC LDPC codeword are mapped to constellation words such that (i) each constellation word is made of bits in B/2 cyclic blocks of the QC LDPC codeword, and (ii) each pair of constellation word bits that are encoded in the same QAM symbol and that have the same robustness level is made of bits in the same cyclic block.

Particularly, the Q×B/2 bits of the B/2 cyclic blocks are mapped to Q/2 spatial-multiplexing blocks. In this case, the B/2 cyclic blocks are referred to as a section.

Figure 12B:
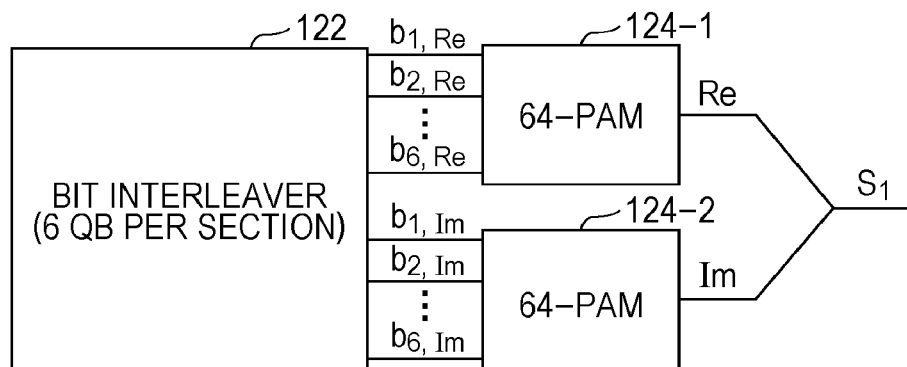
FIG. 12B is a diagram for illustrating one example of the BICM encoder of FIG. 2 based on DVB-NGH.
Figure 12C:
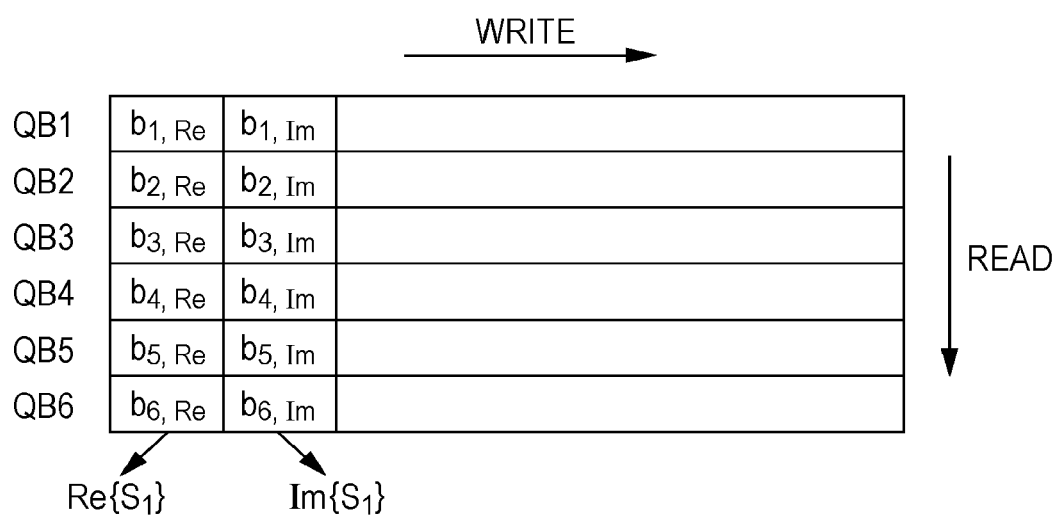
FIG. 12C is a diagram for illustrating one example of the BICM encoder of FIG. 2 based on DVB-NGH.

FIG. 12A to FIG. 12C are diagrams for illustrating one example of BICM encoder 120 of FIG. 2.

FIG. 12A illustrates arrangement of 24 cyclic blocks with four sections. In the example of FIG. 12A, a number of cyclic blocks per section is B/2=12/2=6.

FIG. 12B is a diagram illustrating one example of structure of a pathway from bit interleaver 122 to QAM mapper 124 (including one pair of PAM mappers 124-1, 124-2) in BICM encoder 120 in FIG. 2 based on DVB-NGH.

The LDPC codeword generated by LDPC encoder 121 in FIG. 2 is fed to bit interleaver 122 in FIG. 12B. Bit interleaver 122 is six cyclic blocks per section. Note that processing is performed by bit interleaver 122 and QAM mapper 124 in FIG. 12B (a pair of PAM mappers 124-1, 124-2 are included) for each section in FIG. 12A. Bit interleaver 122 permutates the fed bits, and then arranges the permutated bits to the real part and the imaginary part of the corresponding constellation words. The pair of PAM mappers 124-1, 124-2 map bits $(b_{1,Re}, b_{2,Re}, \ldots, b_{6,Re})$ to a real component (Re) of complex symbol s1, and map bits $(b_{1,Im}, b_{2,Im}, \ldots, b_{6,Im})$ to an imaginary component (Im) of complex symbol s1 by using the 64-PAM constellation.

FIG. 12C is a diagram for illustrating bit permutation executed by bit interleaver 122 in FIG. 12B. As illustrated in FIG. 12C, bit interleaver 122 executes processing equivalent to writing all bits of one section of the codeword row-by-row in a matrix, and to reading the written bits column-by-column from the matrix. Note that this matrix is of B/2 rows and Q columns.

Figure 13B:
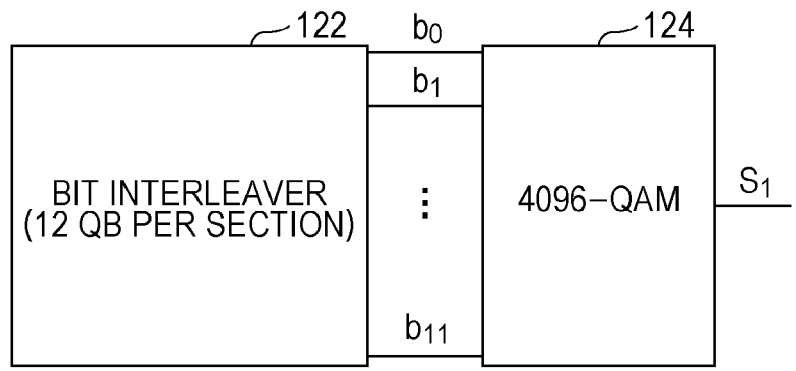
FIG. 13B is a diagram for illustrating one example of the BICM encoder of FIG. 2 based on ATSC 3.0.
Figure 13C:
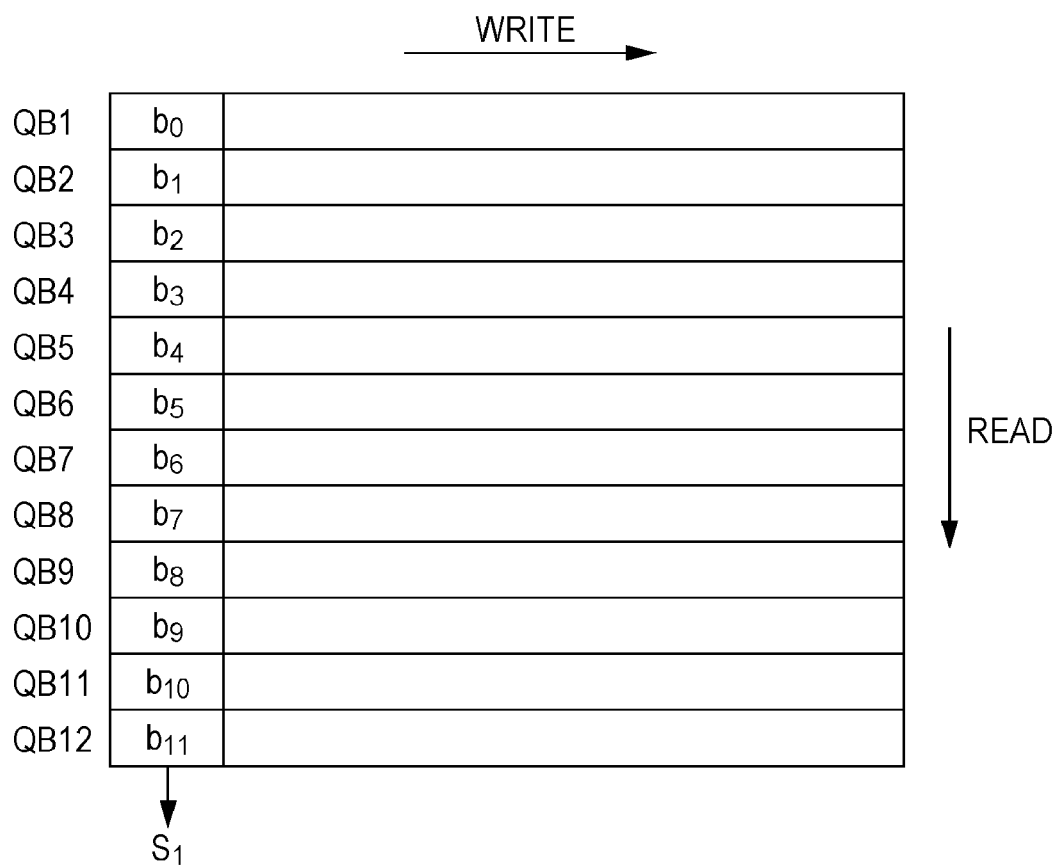
FIG. 13C is a diagram for illustrating one example of the BICM encoder of FIG. 2 based on ATSC 3.0.

FIG. 13A to FIG. 13C are diagrams for illustrating other examples of BICM encoder 120 of FIG. 2. FIG. 13A to FIG. 13C are similar to FIG. 12A to FIG. 12C, respectively, except that FIG. 13A to FIG. 13C illustrate the arrangement based on ATSC 3.0.

FIG. 13A illustrates arrangement of 24 cyclic blocks with two sections. Unlike the case of FIG. 12A, in the example of FIG. 13A, a number of cyclic blocks per section is bit number B of the QAM symbol, and is 12 in the example of FIG. 13A.

FIG. 13B is a diagram illustrating one example of structure of a pathway from bit interleaver 122 to QAM mapper 124 of BICM encoder 120 in FIG. 2 based on ATSC 3.0.

The LDPC codeword generated by LDPC encoder 121 in FIG. 2 is fed to bit interleaver 122 in FIG. 13B. Bit interleaver 122 is 12 cyclic blocks per section. Note that processing is performed by bit interleaver 122 and QAM mapper 124 in FIG. 13B for each section of FIG. 13A. Bit interleaver 122 permutates the fed bits. QAM mapper 124 maps bits $(b_0, b_1, \ldots, b_{11})$ to complex symbol s1 by using the 4096-QAM constellation.

FIG. 13C is a diagram for illustrating bit permutation executed by bit interleaver 122 in FIG. 13B. As illustrated in FIG. 13C, bit interleaver 122 executes processing equivalent to writing all bits of one section of the codeword row-by-row in a matrix, and to reading the written bits column-by-column from the matrix. Note that this matrix is of B rows and Q columns.

Exemplary Embodiment

As described above, the different cyclic block of a determined LDPC code may have a different importance level because the importance level of a bit is dependent on the number of check nodes connected to the bit. Thus, improvement in transmission performance may be achieved by matching the importance level of the cyclic block with robustness of the bit of the constellation word to which this cyclic block is mapped. Particularly, the bit of the cyclic block with the highest importance level is mapped to the bit of the constellation word with the strongest robustness. Conversely, the bit of the cyclic block with the lowest importance level is mapped to the bit of the constellation word with the weakest robustness.

Figure 14:
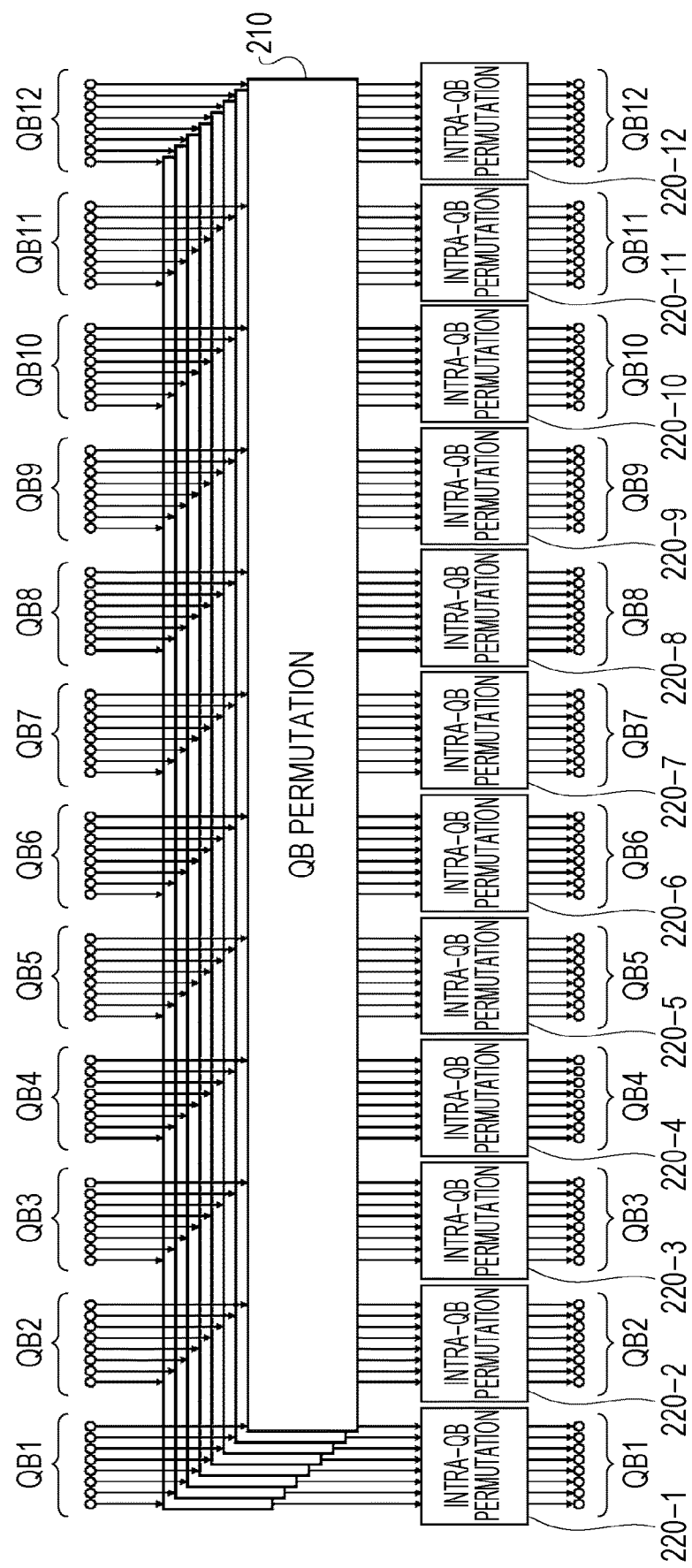
FIG. 14 is a block diagram illustrating one configuration example of a bit interleaver according to an exemplary embodiment of the present disclosure.

FIG. 14 is a block diagram illustrating one configuration example of the bit interleaver according to an exemplary embodiment of the present disclosure. In the example of FIG. 14, the LDPC codeword includes N=12 cyclic blocks QB1, QB2, . . . , QB12 which each include Q=8 bits.

In the bit interleaver, in order to permutate the cyclic blocks within the codeword without affecting a sequence of the bits within each cyclic block in a first stage, a cyclic block permutation (QB permutation) is executed for the codeword. This processing in the first stage is performed by cyclic block permutation unit 210.

In a second stage, in order to permutate the bits within the cyclic blocks, an intra-cyclic block permutation (intra-QB permutation) is executed for the cyclic blocks. This processing in the second stage is executed by intra-QB permutation units 220-1 to 220-12. Note that the second stage may not exist.

In a third stage, after the first stage and the second stage are executed, the bits of each cyclic block of the codeword are mapped to the constellation word. This third stage can be implemented by dividing the codeword into a plurality of sections and performing mapping to the constellation word for each section (section permutation). For example, the third stage is realized by disposing an interleaver (section interleaver) that has a function equivalent to bit interleaver 122 described with reference to FIG. 13A to FIG. 13C, in a subsequent stage of the intra-QB permutation unit.

The inventors have found that improvement in communication performance for a determined LDPC code is achieved by optimizing the cyclic block permutation, that is, by selecting the cyclic block permutation that matches the constellation bits of different reliability with the cyclic blocks of different importance levels.

However, the mapping of the cyclic blocks to the constellation word bits is not straightforward. Since no analytical solution has been known so far, finding an optimized cyclic block permutation is very time-consuming work. A method used for finding the optimal cyclic block permutation disclosed in the present disclosure includes the following steps, and is applied to each of different constellations and different code rates.

In a preliminary step, a very huge number (1e4, . . . , 1e5) of cyclic block permutations are generated randomly under no constraint. Monte-Carlo simulations are executed for these cyclic block permutations by using blind demapping and iterative demapping in order to determine a threshold signal-to-noise ratio (SNR) at a determined target value of a block error rate (BLER). The cyclic block permutation with the lowest threshold SNR, that is, with the best performance is kept.

The inventors have found that optimization of the cyclic block permutation for the blind demapping does not result in optimal performance in the iterative demapping, and vice versa. It remains as a challenging task to find a cyclic block permutation that achieves good performance for both the blind demapping and the iterative demapping.

Thus, cyclic block permutations that achieve good performance for both the blind demapping and the iterative demapping are presented.

An SNR range for various cyclic block permutations is determined from the preliminary step. Then, the threshold SNR is set in order to select only cyclic block permutations that achieve good performance for the blind demapping. The good performance means a low SNR. The threshold SNR should not be set too low. This is because the too low threshold SNR leads to exclusion of many cyclic block permutations that achieve very good performance for the iterative demapping. On the other hand, when the cyclic block permutation that is strictly optimized for the blind demapping is used for the iterative demapping, performance becomes poor. It is a question of experience to select the initial threshold SNR appropriately.

In a first selection step, a large number of cyclic block permutations are generated randomly under no constraint. A BLER curve regarding the blind demapping is determined for each cyclic block permutation by using Monte-Carlo simulations, for example. Only the cyclic block permutations with the SNR at the BELR target value being lower than a determined threshold SNR is kept. The BLER curve regarding the iterative demapping is determined for the kept cyclic block permutations, and the best cyclic block permutation is kept.

In a second selection step, a medium number of cyclic block permutations determined from the cyclic block permutation selected in the first selection step is generated randomly under a constraint. Then, a selection criterion in the first selection step is applied. The constrained cyclic block permutations are determined by application of a random permutation to the cyclic block of one section randomly selected. The application of such a constraint ensures that changes in performance are small and concentrated around the good-performance cyclic block permutation that has already selected in the first selection step. The good-performance cyclic block permutation can be found by this method more effectively than by using blind unconstrained search.

In a third selection step, the medium number of cyclic block permutations determined from the cyclic block permutation selected in the second selection step is generated randomly under a constraint. Then, the selection criterion in the first selection step is applied. The constrained cyclic block permutations are determined by application of random permutations to the bits having the same robustness level. Thus, changes in performance are very small and affect the iterative demapping more than the blind demapping. Accordingly, the performance regarding the iterative demapping is optimized without scarification of the performance regarding the blind demapping.

The inventors have carried out optimization of the cyclic block permutations for each of the code rates 6/15, 7/15, 8/15. In addition, simultaneously with the optimization of the cyclic block permutations, the inventors have determined the optimal non-uniform constellation to be used together with the code rates 6/15, 7/15, 8/15. The following describes QB permutations and non-uniform constellations optimized for each of the code rates 6/15, 7/15, 8/15.

Table 1 and Table 2 are tables illustrating the cyclic block permutations and non-uniform 64-PAM constellations that constitute non-uniform 4096-QAM constellations according to the present disclosure when the code rate is 6/15, respectively.

However, in Table 1, and in Table 3 and Table 5 described below, the indices of the cyclic blocks start with zero and end with 179. "j-th block of Group-wise Interleaver Output" indicates the index of the cyclic block within the codeword after the cyclic blocks are permutated. In addition, "n(j)-th block of Group-wise Interleaver Input" indicates the index of the cyclic block within the codeword before the cyclic blocks are permutated. In addition, in Table 2, and in Table 3 and Table 5 described below, address label x starts with zero and ends with 63. Regarding "Address Label x (integer, MSB first)," an address label of the most significant bit (MSB) of the bits is "0," and an address label of the next bit of the most significant bit is "1." "PAM spots p(x)" indicates the real value of the PAM symbol corresponding to the address label.

TABLE 1

| j-th block of Group-wise Interleaver output | π (j)-th block of Group-wise Interleaver input | j-th block of Group-wise Interleaver output | π (j)-th block of Group-wise Interleaver input | j-th block of Group-wise Interleaver output | π (j)-th block of Group-wise Interleaver input | j-th block of Group-wise Interleaver output | π (j)-th block of Group-wise Interleaver input |
|---|---|---|---|---|---|---|---|
| 0 | 42 | 45 | 175 | 90 | 2 | 135 | 24 |
| 1 | 46 | 46 | 36 | 91 | 127 | 136 | 126 |
| 2 | 135 | 47 | 138 | 92 | 69 | 137 | 58 |
| 3 | 82 | 48 | 100 | 93 | 56 | 138 | 96 |
| 4 | 17 | 49 | 4 | 94 | 176 | 139 | 49 |
| 5 | 50 | 50 | 11 | 95 | 54 | 140 | 170 |
| 6 | 131 | 51 | 168 | 96 | 31 | 141 | 162 |
| 7 | 65 | 52 | 40 | 97 | 38 | 142 | 71 |
| 8 | 145 | 53 | 105 | 98 | 45 | 143 | 85 |
| 9 | 164 | 54 | 103 | 99 | 132 | 144 | 6 |
| 10 | 1 | 55 | 20 | 100 | 118 | 145 | 102 |

TABLE 1-continued

| j-th block of Group-wise Interleaver output | π (j)-th block of Group-wise Interleaver input | j-th block of Group-wise Interleaver output | π (j)-th block of Group-wise Interleaver input | j-th block of Group-wise Interleaver output | π (j)-th block of Group-wise Interleaver input | j-th block of Group-wise Interleaver output | π (j)-th block of Group-wise Interleaver input |
|---|---|---|---|---|---|---|---|
| 11 | 141 | 56 | 152 | 101 | 98 | 146 | 114 |
| 12 | 179 | 57 | 171 | 102 | 83 | 147 | 99 |
| 13 | 130 | 58 | 155 | 103 | 13 | 148 | 62 |
| 14 | 81 | 59 | 93 | 104 | 30 | 149 | 115 |
| 15 | 52 | 60 | 66 | 105 | 149 | 150 | 109 |
| 16 | 142 | 61 | 48 | 106 | 86 | 151 | 122 |
| 17 | 108 | 62 | 124 | 107 | 57 | 152 | 148 |
| 18 | 116 | 63 | 12 | 108 | 22 | 153 | 92 |
| 19 | 174 | 64 | 113 | 109 | 143 | 154 | 106 |
| 20 | 47 | 65 | 73 | 110 | 90 | 155 | 137 |
| 21 | 44 | 66 | 139 | 111 | 34 | 156 | 125 |
| 22 | 157 | 67 | 104 | 112 | 35 | 157 | 129 |
| 23 | 64 | 68 | 107 | 113 | 88 | 158 | 153 |
| 24 | 27 | 69 | 37 | 114 | 79 | 159 | 15 |
| 25 | 144 | 70 | 76 | 115 | 80 | 160 | 33 |
| 26 | 120 | 71 | 72 | 116 | 75 | 161 | 89 |
| 27 | 41 | 72 | 110 | 117 | 0 | 162 | 97 |
| 28 | 91 | 73 | 154 | 118 | 146 | 163 | 8 |
| 29 | 84 | 74 | 10 | 119 | 112 | 164 | 167 |
| 30 | 29 | 75 | 43 | 120 | 67 | 165 | 177 |
| 31 | 169 | 76 | 18 | 121 | 63 | 166 | 9 |
| 32 | 156 | 77 | 78 | 122 | 77 | 167 | 172 |
| 33 | 123 | 78 | 151 | 123 | 136 | 168 | 25 |
| 34 | 53 | 79 | 16 | 124 | 51 | 169 | 26 |
| 35 | 21 | 80 | 70 | 125 | 14 | 170 | 133 |
| 36 | 121 | 81 | 7 | 126 | 60 | 171 | 101 |
| 37 | 94 | 82 | 140 | 127 | 59 | 172 | 166 |
| 38 | 147 | 83 | 87 | 128 | 39 | 173 | 32 |
| 39 | 159 | 84 | 23 | 129 | 128 | 174 | 111 |
| 40 | 117 | 85 | 68 | 130 | 74 | 175 | 61 |
| 41 | 163 | 86 | 3 | 131 | 119 | 176 | 28 |
| 42 | 178 | 87 | 19 | 132 | 150 | 177 | 160 |
| 43 | 55 | 88 | 134 | 133 | 158 | 178 | 165 |
| 44 | 173 | 89 | 161 | 134 | 5 | 179 | 95 |

TABLE 2

| Address Label x (integer, MSB first) | PAM spots p (x) | Address Label x (integer, MSB first) | PAM spots p (x) | Address Label x (integer, MSB first) | PAM spots p (x) | Address Label x (integer, MSB first) | PAM spots p (x) |
|---|---|---|---|---|---|---|---|
| 0 | 1.7263 | 16 | 0.1107 | 32 | −1.7263 | 48 | −0.1107 |
| 1 | 1.4611 | 17 | 0.111 | 33 | −1.4611 | 49 | −0.111 |
| 2 | 1.1929 | 18 | 0.1099 | 34 | −1.1929 | 50 | −0.1099 |
| 3 | 1.2504 | 19 | 0.11 | 35 | −1.2504 | 51 | −0.11 |
| 4 | 0.9179 | 20 | 0.1161 | 36 | −0.9179 | 52 | −0.1161 |
| 5 | 0.9107 | 21 | 0.1166 | 37 | −0.9107 | 53 | −0.1166 |
| 6 | 0.9856 | 22 | 0.1157 | 38 | −0.9856 | 54 | −0.1157 |
| 7 | 0.972 | 23 | 0.1158 | 39 | −0.972 | 55 | −0.1158 |
| 8 | 0.5891 | 24 | 0.3626 | 40 | −0.5891 | 56 | −0.3626 |
| 9 | 0.5902 | 25 | 0.3619 | 41 | −0.5902 | 57 | −0.3619 |
| 10 | 0.5809 | 26 | 0.366 | 42 | −0.5809 | 58 | −0.366 |
| 11 | 0.5821 | 27 | 0.3659 | 43 | −0.5821 | 59 | −0.3659 |
| 12 | 0.6911 | 28 | 0.3341 | 44 | −0.6911 | 60 | −0.3341 |
| 13 | 0.6944 | 29 | 0.3333 | 45 | −0.6944 | 61 | −0.3333 |
| 14 | 0.6678 | 30 | 0.3374 | 46 | −0.6678 | 62 | −0.3374 |
| 15 | 0.6709 | 31 | 0.3368 | 47 | −0.6709 | 63 | −0.3368 |

Table 3 and Table 4 are tables illustrating the cyclic block permutations and the non-uniform 64-PAM constellations that constitute the non-uniform 4096-QAM constellations according to the present disclosure when the code rate is 7/15, respectively.

TABLE 3

| j-th block of Group-wise Interleaver output | π (j)-th block of Group-wise Interleaver input | j-th block of Group-wise Interleaver output | π (j)-th block of Group-wise Interleaver input | j-th block of Group-wise Interleaver output | π (j)-th block of Group-wise Interleaver input | j-th block of Group-wise Interleaver output | π (j)-th block of Group-wise Interleaver input |
|---|---|---|---|---|---|---|---|
| 0 | 59 | 45 | 101 | 90 | 138 | 135 | 24 |
| 1 | 122 | 46 | 4 | 91 | 51 | 136 | 117 |
| 2 | 161 | 47 | 5 | 92 | 89 | 137 | 154 |
| 3 | 93 | 48 | 87 | 93 | 88 | 138 | 157 |
| 4 | 37 | 49 | 106 | 94 | 167 | 139 | 164 |
| 5 | 112 | 50 | 79 | 95 | 80 | 140 | 143 |
| 6 | 111 | 51 | 104 | 96 | 142 | 141 | 12 |
| 7 | 62 | 52 | 168 | 97 | 108 | 142 | 56 |
| 8 | 42 | 53 | 163 | 98 | 69 | 143 | 152 |
| 9 | 102 | 54 | 170 | 99 | 7 | 144 | 20 |
| 10 | 119 | 55 | 57 | 100 | 103 | 145 | 85 |
| 11 | 72 | 56 | 83 | 101 | 115 | 146 | 84 |
| 12 | 60 | 57 | 44 | 102 | 99 | 147 | 77 |
| 13 | 144 | 58 | 54 | 103 | 135 | 148 | 158 |
| 14 | 34 | 59 | 110 | 104 | 36 | 149 | 107 |
| 15 | 120 | 60 | 30 | 105 | 11 | 150 | 32 |
| 16 | 46 | 61 | 50 | 106 | 166 | 151 | 153 |
| 17 | 31 | 62 | 82 | 107 | 169 | 152 | 147 |
| 18 | 129 | 63 | 10 | 108 | 8 | 153 | 132 |
| 19 | 172 | 64 | 148 | 109 | 165 | 154 | 124 |
| 20 | 149 | 65 | 98 | 110 | 68 | 155 | 52 |
| 21 | 94 | 66 | 41 | 111 | 173 | 156 | 121 |
| 22 | 65 | 67 | 22 | 112 | 140 | 157 | 58 |
| 23 | 9 | 68 | 96 | 113 | 95 | 158 | 118 |
| 24 | 0 | 69 | 49 | 114 | 179 | 159 | 137 |
| 25 | 76 | 70 | 90 | 115 | 2 | 160 | 114 |
| 26 | 13 | 71 | 100 | 116 | 125 | 161 | 97 |
| 27 | 61 | 72 | 29 | 117 | 105 | 162 | 19 |
| 28 | 3 | 73 | 39 | 118 | 1 | 163 | 155 |
| 29 | 70 | 74 | 175 | 119 | 116 | 164 | 67 |
| 30 | 40 | 75 | 38 | 120 | 150 | 165 | 25 |
| 31 | 78 | 76 | 109 | 121 | 174 | 166 | 17 |
| 32 | 127 | 77 | 91 | 122 | 15 | 167 | 126 |
| 33 | 35 | 78 | 74 | 123 | 75 | 168 | 23 |
| 34 | 145 | 79 | 159 | 124 | 64 | 169 | 43 |
| 35 | 28 | 80 | 139 | 125 | 176 | 170 | 27 |
| 36 | 48 | 81 | 177 | 126 | 81 | 171 | 21 |
| 37 | 162 | 82 | 71 | 127 | 55 | 172 | 136 |
| 38 | 92 | 83 | 47 | 128 | 130 | 173 | 131 |
| 39 | 73 | 84 | 146 | 129 | 151 | 174 | 26 |
| 40 | 6 | 85 | 63 | 130 | 156 | 175 | 14 |
| 41 | 134 | 86 | 86 | 131 | 53 | 176 | 18 |
| 42 | 66 | 87 | 45 | 132 | 171 | 177 | 128 |
| 43 | 160 | 88 | 123 | 133 | 16 | 178 | 141 |
| 44 | 133 | 89 | 33 | 134 | 113 | 179 | 178 |

TABLE 4

| Address Label x (integer, MSB first) | PAM spots p(x) | Address Label x (integer, MSB first) | PAM spots p(x) | Address Label x (integer, MSB first) | PAM spots p(x) | Address Label x (integer, MSB first) | PAM spots p(x) |
|---|---|---|---|---|---|---|---|
| 0 | 1.6851 | 16 | 0.081 | 32 | −1.6851 | 48 | −0.081 |
| 1 | 1.4381 | 17 | 0.0808 | 33 | −1.4381 | 49 | −0.0808 |
| 2 | 1.1766 | 18 | 0.081 | 34 | −1.1766 | 50 | −0.081 |
| 3 | 1.2355 | 19 | 0.0807 | 35 | −1.2355 | 51 | −0.0807 |
| 4 | 0.9162 | 20 | 0.1456 | 36 | −0.9162 | 52 | −0.1456 |
| 5 | 0.9089 | 21 | 0.1456 | 37 | −0.9089 | 53 | −0.1456 |
| 6 | 1.0012 | 22 | 0.1456 | 38 | −1.0012 | 54 | −0.1456 |
| 7 | 0.9771 | 23 | 0.1457 | 39 | −0.9771 | 55 | −0.1457 |
| 8 | 0.5684 | 24 | 0.4036 | 40 | −0.5684 | 56 | −0.4036 |
| 9 | 0.5681 | 25 | 0.4036 | 41 | −0.5681 | 57 | −0.4036 |
| 10 | 0.5704 | 26 | 0.4043 | 42 | −0.5704 | 58 | −0.4043 |
| 11 | 0.57 | 27 | 0.4042 | 43 | −0.57 | 59 | −0.4042 |
| 12 | 0.7385 | 28 | 0.3059 | 44 | −0.7385 | 60 | −0.3059 |
| 13 | 0.7425 | 29 | 0.306 | 45 | −0.7425 | 61 | −0.306 |
| 14 | 0.7155 | 30 | 0.3056 | 46 | −0.7155 | 62 | −0.3056 |
| 15 | 0.7186 | 31 | 0.3057 | 47 | −0.7186 | 63 | −0.3057 |

Table 5 and Table 6 are tables illustrating the cyclic block permutations and the non-uniform 64-PAM constellations that constitute the non-uniform 4096-QAM constellations according to the present disclosure when the code rate is equal to 8/15, respectively.

TABLE 5

| j-th block of Group-wise Interleaver output | π (j)-th block of Group-wise Interleaver input | j-th block of Group-wise Interleaver output | π (j)-th block of Group-wise Interleaver input | j-th block of Group-wise Interleaver output | π (j)-th block of Group-wise Interleaver input | j-th block of Group-wise Interleaver output | π (j)-th block of Group-wise Interleaver input |
|---|---|---|---|---|---|---|---|
| 0 | 82 | 45 | 161 | 90 | 56 | 135 | 166 |
| 1 | 75 | 46 | 69 | 91 | 144 | 136 | 16 |
| 2 | 51 | 47 | 8 | 92 | 74 | 137 | 131 |
| 3 | 24 | 48 | 156 | 93 | 89 | 138 | 105 |
| 4 | 96 | 49 | 52 | 94 | 14 | 139 | 159 |
| 5 | 80 | 50 | 45 | 95 | 107 | 140 | 0 |
| 6 | 152 | 51 | 27 | 96 | 37 | 141 | 136 |
| 7 | 118 | 52 | 154 | 97 | 113 | 142 | 115 |
| 8 | 147 | 53 | 129 | 98 | 44 | 143 | 122 |
| 9 | 169 | 54 | 4 | 99 | 19 | 144 | 117 |
| 10 | 64 | 55 | 38 | 100 | 17 | 145 | 62 |
| 11 | 106 | 56 | 177 | 101 | 35 | 146 | 3 |
| 12 | 60 | 57 | 127 | 102 | 88 | 147 | 178 |
| 13 | 22 | 58 | 49 | 103 | 101 | 148 | 57 |
| 14 | 65 | 59 | 167 | 104 | 28 | 149 | 59 |
| 15 | 46 | 60 | 120 | 105 | 185 | 150 | 179 |
| 16 | 79 | 61 | 100 | 106 | 108 | 151 | 7 |
| 17 | 140 | 62 | 12 | 107 | 109 | 152 | 20 |
| 18 | 133 | 63 | 173 | 108 | 10 | 153 | 34 |
| 19 | 135 | 64 | 84 | 109 | 175 | 154 | 32 |
| 20 | 18 | 65 | 112 | 110 | 160 | 155 | 150 |
| 21 | 171 | 66 | 121 | 111 | 119 | 156 | 174 |
| 22 | 15 | 67 | 151 | 112 | 94 | 157 | 172 |
| 23 | 87 | 68 | 23 | 113 | 39 | 158 | 165 |
| 24 | 90 | 69 | 92 | 114 | 99 | 159 | 68 |
| 25 | 5 | 70 | 146 | 115 | 40 | 160 | 85 |
| 26 | 170 | 71 | 67 | 116 | 134 | 161 | 55 |
| 27 | 42 | 72 | 43 | 117 | 21 | 162 | 114 |
| 78 | 9 | 73 | 158 | 118 | 83 | 163 | 176 |
| 29 | 86 | 74 | 1 | 119 | 58 | 164 | 71 |
| 30 | 132 | 75 | 103 | 120 | 13 | 165 | 66 |
| 31 | 162 | 76 | 141 | 121 | 53 | 166 | 128 |
| 32 | 142 | 77 | 48 | 122 | 26 | 167 | 116 |
| 33 | 93 | 78 | 25 | 123 | 126 | 168 | 163 |
| 34 | 104 | 79 | 50 | 124 | 6 | 169 | 145 |
| 35 | 138 | 80 | 29 | 125 | 47 | 170 | 153 |
| 36 | 102 | 81 | 77 | 126 | 76 | 171 | 139 |
| 37 | 168 | 82 | 124 | 127 | 41 | 172 | 97 |
| 38 | 54 | 83 | 110 | 128 | 11 | 173 | 30 |
| 39 | 78 | 84 | 70 | 129 | 98 | 474 | 157 |
| 40 | 111 | 85 | 33 | 130 | 61 | 175 | 149 |
| 41 | 164 | 86 | 125 | 131 | 73 | 176 | 155 |
| 42 | 95 | 87 | 2 | 132 | 148 | 177 | 72 |
| 43 | 31 | 88 | 91 | 133 | 36 | 178 | 81 |
| 44 | 137 | 89 | 130 | 134 | 143 | 179 | 123 |

TABLE 6

| Address Label x (integer, MSB first) | PAM spots p (x) | Address Label x (integer, MSB first) | PAM spots p (x) | Address Label x (integer, MSB first) | PAM spots p (x) | Address Label x (integer, MSB first) | PAM spots p (x) |
|---|---|---|---|---|---|---|---|
| 0 | 1.6651 | 16 | 0.0695 | 32 | −1.6651 | 48 | −0.0695 |
| 1 | 1.4272 | 17 | 0.0694 | 33 | −1.4272 | 49 | −0.0694 |
| 2 | 1.1713 | 18 | 0.0696 | 34 | −1.1713 | 50 | −0.0696 |
| 3 | 1.2329 | 19 | 0.0697 | 35 | −1.2329 | 51 | −0.0697 |
| 4 | 0.9125 | 20 | 0.1629 | 36 | −0.9125 | 52 | −0.1629 |
| 5 | 0.9069 | 21 | 0.1629 | 37 | −0.9069 | 53 | −0.1629 |
| 6 | 1.0081 | 22 | 0.1629 | 38 | −1.0081 | 54 | −0.1629 |
| 7 | 0.9831 | 23 | 0.163 | 39 | −0.9831 | 55 | −0.163 |
| 8 | 0.5697 | 24 | 0.4194 | 40 | −0.5697 | 56 | −0.4194 |
| 9 | 0.5694 | 25 | 0.4196 | 41 | −0.5694 | 57 | −0.4196 |
| 10 | 0.5739 | 26 | 0.4196 | 42 | −0.5739 | 58 | −0.4196 |
| 11 | 0.5733 | 27 | 0.4195 | 43 | −0.5733 | 59 | −0.4195 |

TABLE 6-continued

| Address Label x (integer, MSB first) | PAM spots p (x) | Address Label x (integer, MSB first) | PAM spots p (x) | Address Label x (integer, MSB first) | PAM spots p (x) | Address Label x (integer, MSB first) | PAM spots p (x) |
|---|---|---|---|---|---|---|---|
| 12 | 0.7459 | 28 | 0.3034 | 44 | −0.7459 | 60 | −0.3034 |
| 13 | 0.7496 | 29 | 0.3035 | 45 | −0.7496 | 61 | −0.3035 |
| 14 | 0.7192 | 30 | 0.3032 | 46 | −0.7192 | 62 | −0.3032 |
| 15 | 0.7216 | 31 | 0.3032 | 47 | −0.7216 | 63 | −0.3032 |

Note that cyclic block permutation unit 210 in FIG. 14 permutates the cyclic blocks within the codeword according to the code rate of the code used by LDPC encoder 121, based on the cyclic block permutations of Table 1, Table 3, and Table 5 according to the code rates 6/15, 7/15, and 8/15, respectively.

Next, operations of the QAM mapper of the present exemplary embodiment will be described.

Mapping to complex cells s (Re, Im) by QAM mapper 124 is performed by calculation of Equation 4 described below. However, non-uniform PAM coordinates p(x) are obtained from Table 2 in the case of the code rate 6/15, from Table 4 in the case of the code rate 7/15, and from Table 6 in the case of the code rate 8/15.

$$s = p(x') + j \times p(x'')$$ [Equation 4]

where address labels x' for real part p (x') are calculated by Equation 5 by using even numbered bits $b_0, b_2, b_4, b_6, b_8, b_{10}$ which are output from the interleaver (section interleaver) (a number of cyclic blocks per section is B) that is disposed in a subsequent stage of FIG. 14 and that has a function equivalent to bit interleaver 122 described with reference to FIG. 13A to FIG. 13C.

$$x' = \sum_{i=0}^{5} 2^{5-i} b_{2i}$$ [Equation 5]

In addition, address label x" of imaginary part p (x") is calculated by Equation 6 by using odd numbered bits $b_1, b_3, b_5, b_7, b_9, b_{11}$ that are output from the above-described section interleaver.

$$x'' = \sum_{i=0}^{5} 2^{5-i} b_{2i+1}$$ [Equation 6]

The above-described cyclic block permutations (for example, Table 1, Table 3, Table 5) and the non-uniform QAM constellations (for example, Table 2, Table 4, Table 6) are relevant to both the transmitter side and the receiver side in a digital communication system. Each of the above-described cyclic block permutations uniquely defines its inverse cyclic block permutation. One of the above-described cyclic block permutations is used for bit interleaving on the transmitter side, and its inverse cyclic block permutation is used for bit de-interleaving on the receiver side. Further, based on the above-described definition of the above-described non-uniform QAM constellation (two-dimensional non-uniform constellation), mapping of constellation words, that is, bits of the codeword to complex cells used for transmission is performed in the transmitter, and demapping of the received complex cells is performed in the receiver on the other side of a communication channel.

The above-described cyclic block permutations and the above-described non-uniform 4096-QAM constellations are optimized for special LDPC codes with the code rates of 6/15, 7/15, 8/15.

Table 7-1, Table 7-2 illustrate definition of this LDPC code with the code rate of 6/15 and a code length of 64800 code bits. Note that actually, the definition of the LDPC code is completed by a last row of Table 7-1 followed by a first row of Table 7-2.

TABLE 7-1

71 276 856 6867 12964 17373 18159 26420 28460 28477
257 322 672 2533 5316 6578 9037 10231 13845 36497
233 765 904 1366 3875 13145 15409 18620 23910 30825
100 224 405 12776 13868 14787 16781 23886 29099 31419
23 496 891 2512 12589 14074 19392 20339 27658 28684
473 712 759 1283 4374 9898 12551 13814 24242 32728
511 567 815 11823 17106 17900 19338 22315 24396 26448
45 733 836 1923 3727 17468 25746 33806 35995 36657
17 487 675 2670 3922 5145 18009 23993 31073 36624
72 751 773 1937 17324 28512 30666 30934 31016 31849
257 343 594 14041 19141 24914 26864 28809 32055 34753
99 241 491 2650 9670 17433 17785 18988 22235 30742
198 299 655 6737 8304 10917 16092 19387 20755 37690
351 916 926 18151 21708 23216 30321 33578 34052 37949
54 332 373 2010 3332 5623 16301 34337 36451 37861
139 257 1068 11090 20289 29694 29732 32640 35133 36404
457 885 968 2115 4956 5422 5949 17570 26673 32387
137 570 619 5006 6099 7979 14429 16650 25443 32789
46 282 287 10258 18383 20258 27186 27494 28429 38266
445 486 1058 1868 9976 11294 20364 23695 30826 35330
134 900 931 12518 14544 17715 19623 21111 33868 34570
62 66 586 8020 20270 23831 31041 31965 32224 35189
174 290 784 6740 14673 17642 26286 27382 33447 34879
332 675 1033 1838 12004 15439 20765 31721 34225 38863
527 558 832 3867 6318 8317 10883 13466 18427 25377
431 780 1021 1112 2873 7675 13059 17793 20570 20771
339 536 1015 5725 6916 10846 14487 21156 28123 32614
456 830 1078 7511 11801 12362 12705 17401 28867 34032
222 538 989 5593 6022 8302 14008 23445 25127 29022
37 393 788 3025 7768 11367 22276 22761 28232 30394
234 257 1045 1307 2908 6337 26530 28142 34129 35997
35 46 978 9912 9978 12567 17843 24194 34887 35206
39 959 967 5027 10847 14657 18859 28075 28214 36325
275 477 823 11376 18073 28997 30521 31661 31941 32116
185 580 966 11733 12013 12760 13358 19372 32534 35504
760 891 1046 11150 20358 21638 29930 31014 33050 34840
360 389 1057 5316 5938 14186 16404 32445 34021 35722
306 344 679 5224 6674 10305 18753 25583 30585 36943

TABLE 7-2

103 171 1016 8780 11741 12144 19470 20955 22495 27377
818 832 894 3883 14279 14497 22505 28129 28719 31246
215 411 760 5886 25612 28556 32213 32704 35901 36130
229 489 1067 2385 8587 20565 23431 28102 30147 32859
288 664 980 8138 8531 21676 23787 26708 28798 34490
89 552 847 6656 9889 23949 26226 27080 31236 35823
66 142 443 3339 3813 7977 14944 15464 19186 25983
605 876 931 16682 17669 25800 28220 33432 35738 37382

TABLE 7-2-continued 346 423 806 5669 7668 8789 9928 19724 24039 27893
48 460 1055 3512 7389 7549 20216 22180 28221 35437
187 636 824 1678 4508 13588 19683 21750 30311 33480
25 768 935 2856 8187 9052 21850 29941 33217 34293
349 624 716 2698 6395 6435 8974 10649 15932 17378
336 410 871 3582 9830 10885 13892 18027 19203 36659
176 849 1078 17302 19379 27964 28164 28720 32557 35495
234 890 1075 9431 9605 9700 10113 11332 12679 24268
516 638 733 8851 19871 22740 25791 30152 32659 35568
253 830 879 2086 16885 22952 23765 25389 34656 37293
94 954 998 2003 3369 6870 7321 29856 31373 34888
79 350 933 4853 6252 11932 12058 21631 24552 24876
246 647 778 4036 10391 10656 13194 32335 32360 34179
149 339 436 6971 8356 8715 11577 22376 28684 31249
36 149 220 6936 18408 19192 19288 23063 28411 35312
273 683 1042 6327 10011 18041 21704 29097 30791 31425
46 138 722 2701 10984 13002 19930 26625 28458 28965
12 1009 1040 1990 2930 5302 21215 22625 23011 29288
125 241 819 2245 3199 8415 21133 26786 27226 38838
45 476 1075 7393 15141 20414 31244 33336 35004 38391
432 578 667 1343 10466 11314 11507 23314 27720 34465
248 291 556 1971 3989 8992 18000 19998 23932 34652
68 694 837 2246 7472 7873 11078 12868 20937 35591
272 924 949 2030 4360 6203 9737 19705 19902 38039
21 314 979 2311 2632 4109 19527 21920 31413 34277
197 253 804 1249 4315 10021 14358 20559 27099 30525
9802 16164 17499 22378 22403 22704 26742 29908
9064 10904 12305 14057 16156 26000 32613 34536
5178 6319 10239 19343 25628 30577 31110 32291

Table 8-1 and Table 8-2 illustrate definition of this LDPC code with the code rate of 7/15 and the code length of 64800 code bits. Note that actually, the definition of the LDPC code is completed by the last row of Table 8-1 followed by the first row of Table 8-2.

TABLE 8-1

460 792 1007 4580 11452 13130 26882 27020 32439
35 472 1056 7154 12700 13326 13414 16828 19102
45 440 772 4854 7863 26945 27684 28651 31875
744 812 892 1509 9018 12925 14140 21357 25106
271 474 761 4268 6706 9609 19701 19707 24870
223 477 662 1987 9247 18376 22148 24948 27694
44 379 786 8823 12322 14666 16377 28688 29924
104 219 562 5832 19665 20615 21043 22759 32180
41 43 870 7963 13718 14136 17216 30470 33428
592 744 887 4513 6192 18116 19482 25032 34095
456 821 1078 7162 7443 8774 15567 17243 33085
151 666 977 6946 10358 11172 18129 19777 32234
236 793 870 2001 6805 9047 13877 30131 34252
297 698 772 3449 4204 11608 22950 26071 27512
202 428 474 3205 3726 6223 7708 20214 25283
139 719 915 1447 2938 11864 15932 21748 28598
135 853 902 3239 18590 20579 30578 33374 34045
9 13 971 11834 13642 17628 21669 24741 30965
344 531 730 1880 16895 17587 21901 28620 31957
7 192 380 3168 3729 5518 6827 20372 34168
28 521 681 4313 7465 14209 21501 23364 25980
269 393 898 3561 11066 11985 17311 26127 30309
42 82 707 4880 4890 9818 23340 25959 31695
189 262 707 6573 14082 22259 24230 24390 24664
383 568 573 5498 13449 13990 16904 22629 34203
585 596 820 2440 2488 21956 28261 28703 29591
755 763 795 5636 16433 21714 23452 31150 34545
23 343 669 1159 3507 13096 17978 24241 34321
316 384 944 4872 8491 18913 21085 23198 24798
64 314 765 3706 7136 8634 14227 17127 23437
220 693 899 8791 12417 13487 18335 22126 27428
285 794 1045 8624 8801 9547 19167 21894 32657
386 621 1045 1634 1882 3172 13686 16027 22448
95 622 693 2827 7098 11452 14112 18831 31308
446 813 928 7976 8935 13146 27117 27766 33111
89 138 241 3218 9283 20458 31484 31538 34216
277 420 704 9281 12576 12788 14496 15357 20585
141 643 758 4894 10264 15144 16357 22478 26461
17 108 160 13183 15424 17939 19276 23714 26655

TABLE 8-1-continued 109 285 608 1682 20223 21791 24615 29622 31983
123 515 622 7037 13946 15292 15606 16262 23742
264 565 923 6460 13622 13934 23181 25475 26134
202 548 789 8003 10993 12478 16051 25114 27579
121 450 575 5972 10062 18693 21852 23874 28031

TABLE 8-2

507 560 889 12064 13316 19629 21547 25461 28732
664 786 1043 9137 9294 10163 23389 31436 34297
45 830 907 10730 16541 21232 30354 30605 31847
203 507 1060 6971 12216 13321 17861 22671 29825
369 881 952 3035 12279 12775 17682 17805 34281
683 709 1032 3787 17623 24138 26775 31432 33626
524 792 1042 12249 14765 18601 25811 32422 33163
137 639 688 7182 8169 10443 22530 24597 29039
159 643 749 16386 17401 24135 28429 33468 33469
107 481 555 7322 13234 19344 23498 26581 31378
249 389 523 3421 10150 17616 19085 20545 32069
395 738 1045 2415 3005 3820 19541 23543 31068
27 293 703 1717 3460 8326 8501 10290 32625
126 247 515 6031 9549 10643 22067 29490 34450
331 471 1007 3020 3922 7580 23358 28620 30946
222 542 1021 3291 3652 13130 16349 33009 34348
532 719 1038 5891 7528 23252 25472 31395 31774
145 398 774 7816 13887 14936 23708 31712 33160
88 536 600 1239 1887 12195 13782 16726 27998
151 269 585 1445 3178 3970 15568 20358 21051
650 819 865 15567 18546 25571 32038 33350 33620
93 469 800 6059 10405 12296 17515 21354 22231
97 206 951 6161 16376 27022 29192 30190 30665
412 549 986 5833 10583 10766 24946 28878 31937
72 604 659 5267 12227 21714 32120 33472 33974
25 902 912 1137 2975 9642 11598 25919 28278
420 976 1055 8473 11512 20198 21662 25443 30119
1 24 932 6426 11899 13217 13935 16548 29737
53 618 988 6280 7267 11676 13575 15532 25787
111 739 809 8133 12717 12741 20253 20608 27850
120 683 943 14496 15162 15440 18660 27543 32404
600 754 1055 7873 9679 17351 27268 33508
344 756 1054 7102 7193 22903 24720 27883
582 1003 1046 11344 23756 27497 27977 32853
28 429 509 11106 11767 12729 13100 31792
131 555 907 5113 10259 10300 20580 23029
406 915 977 12244 20259 26616 27899 32228
46 195 224 1229 4116 10263 13608 17830
19 819 953 7965 9998 13959 30580 30754
164 1003 1032 12920 15975 16582 22624 27357
8433 11894 13531 17675 25889 31384
3166 3813 8596 10368 25104 29584
2466 8241 12424 13376 24837 32711

Table 9-1 and Table 9-2 illustrate definition of this LDPC code with the code rate of 8/15 and the code length of 64800 code bits. Note that actually, the definition of the LDPC code is completed by the last row of Table 9-1 followed by the first row of Table 9-2.

TABLE 9-1

| | |
|---|---|
| 2768 3039 4059 5856 6245 7013 8157 9341 9802 10470 11521 12083 16610 18361 20321 24601 27420 28206 29788 | 5496 15681 21854 |
| 2739 8244 8891 9157 12624 12973 15534 16622 16919 18402 18780 19854 20220 20543 22306 25540 27478 27678 28053 | 12697 13407 22178 |
| 1727 2268 6246 7815 9010 9556 10134 10472 11389 14599 15719 16204 17342 17666 18850 22058 25579 25860 29207 | 12788 21227 22894 |
| 28 1346 3721 5565 7019 9240 12355 13109 14800 16040 16839 17369 17631 19357 19473 19891 20381 23911 29683 | 629 2854 6232 |
| 869 2450 4386 5316 6160 7107 10362 11132 11271 13149 16397 16532 17113 19894 22043 22784 27383 28615 28804 | 2289 18227 27458 |
| 508 4292 5831 8559 10044 10412 11283 14810 15888 17243 17538 19903 20528 22090 22652 27235 27384 28208 28485 | 7593 21935 23001 |
| 389 2248 5840 6043 7000 9054 11075 11760 12217 12565 13587 15403 19422 19528 21493 25142 27777 28566 28702 | 3836 7081 12282 |
| 1015 2002 5764 6777 9346 9629 11009 11153 12690 13068 13990 16841 17702 20021 24106 26300 29332 30081 30196 | 7925 18440 23135 |
| 1480 3084 3467 4401 4798 5187 7851 11368 12323 14325 14546 16360 17158 18010 21333 25612 26556 26906 27005 | 497 6342 9717 |
| 6925 8876 12392 14529 15253 15437 19226 19950 20321 23021 23651 24393 24653 26668 27205 28269 28529 29041 29292 | 11199 22046 30067 |
| 2547 3404 3538 4666 5126 5468 7695 8799 14732 15072 15881 17410 18971 19609 19717 22150 24941 27908 29018 | 12572 28045 28990 |
| 888 1581 2311 5511 7218 9107 10454 12252 13662 15714 15894 17025 18671 24304 25316 25556 28489 28977 29212 | 1240 2023 10933 |
| 1047 1494 1718 4645 5030 6811 7868 8146 10611 15767 17682 18391 22614 23021 23763 25478 26491 29088 29757 | 19566 20629 25186 |
| 59 1781 1900 3814 4121 8044 8906 9175 11156 14841 15789 16033 16755 17292 18550 19310 22505 29567 29850 | 6442 13303 28813 |
| 1952 3057 4399 9476 10171 10769 11335 11569 15002 19501 20621 22642 23452 24360 25109 25290 25828 28505 29122 | 4765 10572 16180 |
| 2895 3070 3437 4764 4905 6670 9244 11845 13352 13573 13975 14600 15871 17996 19672 20079 20579 25327 27958 | 552 19301 24286 |
| 612 1528 2004 4244 4599 4926 5843 7684 10122 10443 12267 14368 18413 19058 22985 24257 26202 26596 27899 | 6782 18480 21383 |
| 1361 2195 4146 6708 7158 7538 9138 9998 14862 15359 16076 18925 21401 21573 22503 24146 24247 27778 29312 | 11267 12288 15758 |
| 5229 6235 7134 7655 9139 13527 15408 16058 16705 18320 19909 20901 22238 22437 23654 25131 27550 28247 29903 | 711 5652 15531 |
| 697 2035 4887 5275 6909 9166 11805 15338 16381 18403 20425 20688 21547 24590 25171 26726 28848 29224 29412 | 16131 20047 25649 |

TABLE 9-2

| | |
|---|---|
| 5379 17329 22659 23062 | 13227 23035 24450 |
| 11814 14759 22329 22936 | 4839 13467 27488 |
| 2423 2811 10296 12727 | 2852 4677 22993 |
| 8460 15260 16769 17290 | 2504 28116 29524 |
| 14191 14608 29536 30187 | 12518 17374 24267 |
| 7103 10069 20111 22850 | 1222 11859 27922 |
| 4285 15413 26448 29069 | 9660 17286 18261 |
| 548 2137 9189 10928 | 232 11296 29978 |
| 4581 7077 23382 23949 | 9750 11165 16295 |
| 3942 17248 19486 27922 | 4894 9505 23622 |
| 8668 10230 16922 26678 | 10861 11980 14110 |
| 6158 9980 13788 28198 | 2128 15883 22836 |
| 12422 16076 24206 29887 | 6274 17243 21989 |
| 8778 10649 18747 22111 | 10866 13202 22517 |
| 21029 22677 27150 28980 | 11159 16111 21608 |
| 7918 15423 27672 27803 | 3719 18787 22100 |
| 5927 18086 23525 | 1756 2020 23901 |
| 3397 15058 30224 | 20913 29473 30103 |
| 24016 25880 26268 | 2729 15091 26976 |
| 1096 4775 7912 | 4410 8217 12963 |
| 3259 17301 20802 | 5395 24564 28235 |
| 129 8396 15132 | 3859 17909 23051 |
| 17825 28119 28676 | 5733 26005 29797 |
| 2343 8382 28840 | 1935 3492 29773 |
| 3907 18374 20939 | 11903 21380 29914 |
| 1132 1290 8786 | 6091 10469 29997 |
| 1481 4710 28846 | 2895 8930 15594 |
| 2185 3705 26834 | 1827 10028 20070 |

Calculation processing of the parity bits performed by LDPC encoder 121 will be described below.

The LDPC code with the code rates of 6/15, 7/15 is defined based on the following algorithm.

The LDPC code is used for encoding information block $s=(s_0, s_1, \ldots, s_{K-1})$, and for accordingly generating codeword A with code length $N=K+M_1+M_2$, $\Lambda=(\lambda_0, \lambda_1, \ldots, \lambda_{N-1})=(\lambda_0, \lambda_1, \ldots, \lambda_{K-1}, p_0, p_1, \ldots, p_{M1+M2-1})$.

where, in the case of the code rate 6/15, $M_1=1080$, $M_2=37800$, $Q_1=3$, $Q_2=105$. In addition, in the case of the code rate 7/15, $M_1=1080$, $M_2=33480$, $Q_1=3$, $Q_2=93$.

LDPC encoder 121 calculates the parity bit as follows.

(1) Initialization by Equation 7 is performed.

$$\lambda_i = s_i \quad \text{[Equation 7]}$$

$$i = 0, 1, \ldots, K-1$$

$$p_j = 0$$

$$j = 0, 1, \ldots, M_1 + M_2 - 1$$

(2) For $\lambda_m$ (where, m=0, 1, ..., 359), $\lambda_m$ is accumulated at parity bit addresses by Equation 8.

$$(x + m \times Q_1) \bmod M_1 \quad \text{[Equation 8]}$$
$$\text{if } x < M_1$$
$$M_1 + \{(x - M_1 + m \times Q_2) \bmod M_2\}$$
$$\text{if } x \geq M_1$$

where x indicates the address of the parity bit accumulator corresponding to first bit $\lambda_0$. Note that mod represents a modulo operator (the same applies to the followings).

(3) For 360-th information bit $\lambda_L$, the addresses of the parity bit accumulators are provided in the second row of the definition based on each of Table 7-1 and Table 7-2 in the case of the code rate 6/15, and the addresses of the parity bit accumulators are provided in the second row of the definition based on each of Table 8-1 and Table 8-2 in the case of the code rate 7/15. Similarly, the addresses of the parity bit accumulators for next $\lambda_m$ (where m=L+1, L+2, ..., L+359) are obtained by Equation 9.

$$(x + m \times Q_1) \bmod M_1 \quad \text{[Equation 9]}$$
$$\text{if } x < M_1$$
$$M_1 + \{(x - M_1 + m \times Q_2) \bmod M_2\}$$
$$\text{if } x \geq M_1$$

where x indicates the address of $\lambda_L$. In the case of the code rate 6/15, x is a value in the second row of the definition based on each of Table 7-1 and Table 7-2, and in the case of the code rate 7/15, x is a value in the second row of the definition based on each of Table 8-1 and Table 8-2.

(4) Similarly, a new row of the definition based on each of Table 7-1 and Table 7-2 in the case of the code rate 6/15, and a new row of the definition based on each of Table 8-1 and Table 8-2 in the case of the code rate of 7/15 are used for each group of new 360 information bits in order to find the addresses of the parity bit accumulators.

(5) After the codeword bits from $\lambda_0$ to $\lambda_{K-1}$ are processed, an operation expressed by Equation 10 is performed sequentially with start of i=1.

$$p_i = p_i \oplus p_{i-1} \quad \text{[Equation 10]}$$

for $i = 1, 2, \ldots, M_1 - 1$ (6) The parity bits from $\lambda_K$ to $\lambda_{K+M1-1}$ are obtained by using an interleaving operation of L=360 expressed by Equation 11.

$$\lambda_{K+L \times t+s} = p_{Q_1 \times s+t} \quad \text{[Equation 11]}$$

for $0 \le s < L$, $0 \le t < Q_1$ (7) The addresses of the parity bit accumulators are calculated by Equation 12 for each group of the new codeword bits of L=360 from $\lambda_K$ to $\lambda_{K+M1-1}$, by using a new row of the definition based on each of Table 7-1 and Table 7-2 in the case of the code rate 6/15, and by using a new row of the definition based on each of Table 8-1 and Table 8-2 in the case of the code rate 7/15.

$$(x + m \times Q_1) \bmod M_1 \quad \text{[Equation 12]}$$

if $x < M_1$ $M_1 + \{(x - M_1 + m \times Q_2) \bmod M_2\}$ if $x \ge M_1$ where x indicates the address corresponding to a head code bit of each group of the codeword bits. In the case of the code rate 6/15, x is a value of the row corresponding to each group of the definition based on each of Table 7-1 and Table 7-2. In the case of the code rate 7/15, x is a value of the row corresponding to each group of the definition based on each of Table 8-1 and Table 8-2.

(8) After the codeword bits from $\lambda_K$ to $\lambda_{K+M1-1}$ are processed, the parity bits from $\lambda_{K+M1}$ to $\lambda_{K+M1+M2-1}$ are obtained by using an interleaving operation of L=360 expressed by Equation 13.

$$\lambda_{K+M_1+L \times t+s} = p_{M_1+Q_2 \times s+t} \quad \text{[Equation 13]}$$

for $0 \le s < L$, $0 \le t < Q_2$ (9) Subsequently, codeword bits $\lambda_i$ (i=0, 1, ..., N−1) are sent to cyclic block permutation unit 210 of the bit interleaver.

The LDPC code with the code rate of 8/15 is defined by the following algorithm.

(1) The bits of the LDPC codeword are denoted as $c_0, c_1, \ldots, c_{N-1}$, and the first K bits are equal to information bits and are represented by Equation 14.

$$c_k = i_k \quad \text{[Equation 14]}$$

for $0 \le k < K$

Then, parity bit $p_k = c_{k+K}$ is calculated as follows by LDPC encoder 121.

(2) Initialization by Equation 15 is performed.

$$p_k = 0 \quad \text{[Equation 15]}$$

for $0 \le k < N - K$ where N=64800, and K=N×code rate.

(3) For k which is equal to or greater than 0 and is less than K, i is a maximum integer that is not larger than a value obtained by division of k by 360, and l=k mod 360. For all j, $i_k$ is accumulated in $p_{q(i,j,k)}$, as expressed by Equation 16.

$$p_{q(i,0,l)} = p_{q(i,0,l)} + i_k \quad \text{[Equation 16]}$$

$$p_{q(i,1,l)} = p_{q(i,1,l)} + i_k$$

$$p_{q(i,2,l)} = p_{q(i,2,l)} + i_k$$

$$\vdots$$

$$p_{q(i,w(i)-1,l)} = p_{q(i,w(i)-1,l)} + i_k$$

where w(i) is a number of elements in the i-th row in the index list of the definition based on each of Table 9-1 and Table 9-2.

(4) Processing by Equation 17 is performed on all k of 0<k<N−K.

$$p_k = (p_k + p_{k-1}) \bmod 2 \quad \text{[Equation 17]}$$

(5) All codeword bits $c_0, c_1, \ldots, c_{N-1}$ are obtained in the above-described steps. A parity interleaver expressed by Equation 18 is applied to the last N−K codeword bits.

$$u_i = c_i \quad \text{[Equation 18]}$$

$0 \le i < k$ $u_{K+360 \times t+s} = c_{K+R \times s+t}$ for $0 \le s < 360$, $0 \le t < R$ A role of the parity interleaver is to convert the staircase structure of the parity part of the LDPC parity-check matrix into a quasi-cyclic structure similar to the information part of the matrix. Parity interleaved codeword bits $c_0, c_1, \ldots, c_{N-1}$ are sent to cyclic block permutation unit 210 of the bit interleaver.

Parameters q (i, j, 0) indicate j-th entry of the i-th row in the index list of the definition based on each of Table 9-1 and Table 9-2, and satisfy a relationship of Equation 19.

$$q(i, j, l) = q(i, j, 0) + R \times I(\mathrm{mod}(N - k))$$ [Equation 19]

$$\text{for } 0 < l < 360$$

Every accumulation is realized by addition regarding the Galois field GF (2). R is 84 in the case of the code rate 8/15.

<<Supplemental (1)>>

The present disclosure is not limited to the description provided in the above-described exemplary embodiment, and can be carried out in any form for achieving the object of the present disclosure and an object related or relevant to the object of the present disclosure. For example, the present disclosure may be as follows.

(1) The present disclosure is described with reference to the special exemplary embodiment illustrated in the accompanying drawings, particularly, by presenting one example as values of key parameters N, M, Q. However, the present disclosure is not limited to the specific combination of these parameters. In fact, the present disclosure is applicable to any combination practically relevant to values (positive integers) for these parameters, such as those described in the DVB-T2 standard or those defined by a similar standard.

(2) The present disclosure is not limited to a specific form for implementing the disclosed methods or devices in both software and hardware.

Particularly, the present disclosure may be implemented in a form of a computer-readable medium that embodies computer-executable instructions adapted such that a computer, a microprocessor, a microcontroller, and the like can execute all the steps of the method according to the exemplary embodiment of the present disclosure.

In addition, the present disclosure may be implemented in a form of an application-specific integrated circuit (ASIC) or in a form of a field programmable gate array (FPGA).

(3) The present disclosure relates to a digital communication system based on the QC LDPC codes and high-order constellations. The present disclosure provides special permutations that permutate the LDPC code bits and special non-uniform constellations that transmit interleaved codewords. The permutations and the non-uniform constellations are jointly optimized at the code rate of 6/15, 7/15, or 8/15.

<<Supplemental (2)>>

The communication method and the like according to the present disclosure will be summarized as follows.

(1) A first communication method is a data communication method for performing data communication in a digital communication system using a quasi-cyclic low-density parity-check code including a repeat-accumulate quasi-cyclic low-density parity-check code. The communication method includes an interleaving step of executing a cyclic block permutation for a codeword generated based on the quasi-cyclic parity-check code, where the codeword includes a sequence of N cyclic blocks, each of the N cyclic blocks includes Q bits, each of N and Q is a positive integer, and the cyclic block permutation is permutation of the cyclic blocks within the codeword, and a constellation mapping step of mapping each of the bits of the codeword for which the cyclic block permutation is executed to a constellation point of a non-uniform constellation. In the communication method, the cyclic block permutation and the non-uniform constellation are selected based on a code rate of the quasi-cyclic low-density parity-check code used for generation of the codeword.

(2) According to a second communication method, in the first communication method, the code rate of the quasi-cyclic low-density parity-check code is 6/15, and the non-uniform constellation is a non-uniform 4096-QAM constellation having real coordinates and complex coordinates each of which is a non-uniform 64-PAM constellation given according to Table 2 described above.

(3) According to a third communication method, in the first or second communication method, the code rate of the quasi-cyclic low-density parity-check code is 6/15, and the cyclic block permutation is defined according to Table 1 described above.

(4) According to a fourth communication method, in the first communication method, the code rate of the quasi-cyclic low-density parity-check code is 7/15, and the non-uniform constellation is a non-uniform 4096-QAM constellation having real coordinates and complex coordinates each of which is a non-uniform 64-PAM constellation given according to Table 4 described above.

(5) According to a fifth communication method, in the first or fourth communication method, the code rate of the quasi-cyclic low-density parity-check code is 7/15, and the cyclic block permutation is defined according to Table 3 described above.

(6) According to a sixth communication method, in the first communication method, the code rate of the quasi-cyclic low-density parity-check code is 8/15, and the non-uniform constellation is a non-uniform 4096-QAM constellation having real coordinates and complex coordinates each of which is a non-uniform 64-PAM constellation given according to Table 6 described above.

(7) According to a seventh communication method, in the first or sixth communication method, the code rate of the quasi-cyclic low-density parity-check code is 8/15, and the cyclic block permutation is defined according to Table 5 described above.

(8) According to an eighth communication method, in any one of the first to seventh communication methods, N is equal to 180 and Q is equal to 360.

(9) According to a ninth communication method, in any one of the first to eighth communication methods, the quasi-cyclic parity-check code used for generation of the codeword is selected from a plurality of the determined quasi-cyclic parity-check codes having code rates different from each other.

(10) A first communication device is a communication device in a digital communication system that performs communication by any one of the first to ninth communication methods.

(11) A tenth communication method is a data communication method for performing data communication in a digital communication system using quasi-cyclic low-density parity-check including a repeat-accumulate quasi-cyclic low-density parity-check code. The communication method includes executing a cyclic block permutation for a codeword generated based on the quasi-cyclic low-density parity-check code, performing demapping based on a non-uniform constellation on each of complex cells obtained by performing constellation mapping of the non-uniform constellation on a bit of the codeword for which the cyclic block permutation is executed, and performing processing inverse to the cyclic block permutation on a result of the demapping.

(12) A second communication device is a communication device in a digital communication system that performs communication by the tenth communication method.

(13) An eleventh communication method includes executing a cyclic block permutation for a codeword generated based on a quasi-cyclic low-density parity-check code including a repeat-accumulate quasi-cyclic low-density parity-check code, where the codeword includes a sequence of N cyclic blocks, each of the N cyclic blocks includes Q bits, each of N and Q is a positive integer, and the cyclic block permutation is permutation of the cyclic blocks within the codeword, mapping each of the bits of the codeword for which the cyclic block permutation is executed to any one of constellation points of a non-uniform constellation, and transmitting the mapped codeword. In the eleventh communication method, the cyclic block permutation and the non-uniform constellation are selected based on a code rate of the quasi-cyclic low-density parity-check code used for generation of the codeword, in a case where the code rate of the quasi-cyclic low-density parity-check code is equal to 7/15, the cyclic block permutation is defined according to Table 1.

According to a twelfth communication method, in the eleventh communication method, N is equal to 180, and Q is equal to 360.

According to a thirteenth communication method, in the eleventh communication method, the quasi-cyclic parity-check code used for generation of the codeword is selected from a plurality of the determined quasi-cyclic parity-check codes having the code rates different from each other.

A third communication device includes interleaving circuitry which, in operation, executes a cyclic block permutation for a codeword generated based on a quasi-cyclic low-density parity-check code including a repeat-accumulate quasi-cyclic low-density parity-check code, where the codeword includes a sequence of N cyclic blocks, each of the N cyclic blocks includes Q bits, each of N and Q is a positive integer, and the cyclic block permutation is permutation of the cyclic blocks within the codeword, a constellation mapping circuitry which, in operation, maps each of the bits of the codeword for which the cyclic block permutation is executed to any one of constellation points of a non-uniform constellation, and a transmitting circuitry which, in operation, transmits the mapped codeword. In the third communication device, the cyclic block permutation and the non-uniform constellation are selected based on a code rate of the quasi-cyclic low-density parity-check code used for generation of the codeword, in a case where the code rate of the quasi-cyclic low-density parity-check code is equal to 7/15, the cyclic block permutation is defined according to Table 3.

Although various exemplary embodiments have been described above with reference to the drawings, the present disclosure is of course not limited to such examples. It will be apparent that various changes or modifications are conceivable by those skilled in the art within the scope described in the appended claims. It is understood that those changes or modifications naturally belong to the technical scope of the present disclosure. In addition, the components in the aforementioned exemplary embodiments may be combined in any manner within the spirit of the disclosure.

Although the above-described exemplary embodiments have described the example in which the configuration in the present disclosure is made by using hardware, the present disclosure can also be realized by software in cooperation with hardware.

In addition, the functional blocks used for the description of the above-described exemplary embodiments are each typically realized as an LSI that is an integrated circuit having input terminals and output terminals. These functional blocks may be individually integrated into one chip, or may be integrated into one chip such that part or all of the functional blocks are incorporated. Although the integrated circuit is an LSI here, the integrated circuit may be referred to as an IC, a system LSI, a super LSI, and an ultra LSI, depending on a difference in a degree of integration.

In addition, an approach for circuit integration is not limited to an LSI, and circuit integration may be realized by using a dedicated circuit or a general-purpose processor. A field programmable gate array (FPGA) which is programmable after manufacture of an LSI, or a reconfigurable processor in which connection or settings of circuit cells within the LSI are reconfigurable may be used.

Further, when an advance in semiconductor technologies or other related technologies yields a circuit integration technology that can substitute for an LSI, the functional blocks may of course be integrated by using such a technology. For example, application of biotechnology may be possible.

The present disclosure can be used for a BICM system that uses a QC LDPC code and QAM.

What is claimed is:

1. A transmission method performed by a transmitter, the transmission method comprising:
  generating, by a coding circuit of the transmitter, a codeword according to repeat accumulate quasi-cyclic low-density parity-check coding such that the codeword consists of N cyclic blocks, the N cyclic blocks each consist of Q bits, each of N and Q is a positive integer, and a code rate of the codeword is 7/15;
  reordering, by an interleaving circuit of the transmitter, the N cyclic blocks;
  mapping, by a mapping circuit of the transmitter, bits in the codeword onto constellation points of a non-uniform 4096 QAM scheme to generate mapped bits after the N cyclic blocks are reordered; and
  generating, by a signaling circuit of the transmitter, a transmission signal by performing orthogonal frequency-division multiplexing (OFDM) modulation on the mapped bits, wherein
  the N cyclic blocks are reordered according to Table 1 which is associated with the code rate, and in the Table 1, the j-th block of Group-wise Interleaver Output indicates the index of the cyclic block after the N cyclic blocks are reordered, and the it(j)-th block of Group-wise Interleaver Input indicates the index of the cyclic block before the N cyclic blocks are reordered

TABLE 1

| j-th block of Group-wise Interleaver output | π (j)-th block of Group-wise Interleaver input |
|---|---|
| 0 | 59 |
| 1 | 122 |
| 2 | 161 |
| 3 | 93 |
| 4 | 37 |
| 5 | 112 |
| 6 | 111 |
| 7 | 62 |
| 8 | 42 |
| 9 | 102 |
| 10 | 119 |
| 11 | 72 |
| 12 | 60 |
| 13 | 144 |
| 14 | 34 |
| 15 | 120 |
| 16 | 46 |
| 17 | 31 |
| 18 | 129 |
| 19 | 172 |
| 20 | 149 |
| 21 | 94 |
| 22 | 65 |
| 23 | 9 |
| 24 | 0 |
| 25 | 76 |
| 26 | 13 |
| 27 | 61 |
| 28 | 3 |
| 29 | 70 |
| 30 | 40 |
| 31 | 78 |
| 32 | 127 |
| 33 | 35 |
| 34 | 145 |
| 35 | 28 |
| 36 | 48 |
| 37 | 162 |
| 38 | 92 |
| 39 | 73 |
| 40 | 6 |
| 41 | 134 |
| 42 | 66 |
| 43 | 160 |
| 44 | 133 |
| 45 | 101 |
| 46 | 4 |
| 47 | 5 |
| 48 | 87 |
| 49 | 106 |
| 50 | 79 |
| 51 | 104 |
| 52 | 168 |
| 53 | 163 |
| 54 | 170 |
| 55 | 57 |
| 56 | 83 |
| 57 | 44 |
| 58 | 54 |
| 59 | 110 |
| 60 | 30 |
| 61 | 50 |

TABLE 1-continued

| j-th block of Group-wise Interleaver output | π (j)-th block of Group-wise Interleaver input |
|---|---|
| 62 | 82 |
| 63 | 10 |
| 64 | 148 |
| 65 | 98 |
| 66 | 41 |
| 67 | 22 |
| 68 | 96 |
| 69 | 49 |
| 70 | 90 |
| 71 | 100 |
| 72 | 29 |
| 73 | 39 |
| 74 | 175 |
| 75 | 38 |
| 76 | 109 |
| 77 | 91 |
| 78 | 74 |
| 79 | 159 |
| 80 | 139 |
| 81 | 177 |
| 82 | 71 |
| 83 | 47 |
| 84 | 146 |
| 85 | 63 |
| 86 | 86 |
| 87 | 45 |
| 88 | 123 |
| 89 | 33 |
| 90 | 138 |
| 91 | 51 |
| 92 | 89 |
| 93 | 88 |
| 94 | 167 |
| 95 | 80 |
| 96 | 142 |
| 97 | 108 |
| 98 | 69 |
| 99 | 7 |
| 100 | 103 |
| 101 | 115 |
| 102 | 99 |
| 103 | 135 |
| 104 | 36 |
| 105 | 11 |
| 106 | 166 |
| 107 | 169 |
| 108 | 8 |
| 109 | 165 |
| 110 | 68 |
| 111 | 173 |
| 112 | 140 |
| 113 | 95 |
| 114 | 179 |
| 115 | 2 |
| 116 | 125 |
| 117 | 105 |
| 118 | 1 |
| 119 | 116 |
| 120 | 150 |
| 121 | 174 |
| 122 | 15 |
| 123 | 75 |
| 124 | 64 |
| 125 | 176 |
| 126 | 81 |
| 127 | 55 |
| 128 | 130 |
| 129 | 151 |
| 130 | 156 |
| 131 | 53 |
| 132 | 171 |
| 133 | 16 |

TABLE 1-continued

| j-th block of Group-wise Interleaver output | π (j)-th block of Group-wise Interleaver input |
|---|---|
| 134 | 113 |
| 135 | 24 |
| 136 | 117 |
| 137 | 154 |
| 138 | 157 |
| 139 | 164 |
| 140 | 143 |
| 141 | 12 |
| 142 | 56 |
| 143 | 152 |
| 144 | 20 |
| 145 | 85 |
| 146 | 84 |
| 147 | 77 |
| 148 | 158 |
| 149 | 107 |
| 150 | 32 |
| 151 | 153 |
| 152 | 147 |
| 153 | 132 |

TABLE 1-continued

| j-th block of Group-wise Interleaver output | π (j)-th block of Group-wise Interleaver input |
|---|---|
| 154 | 124 |
| 155 | 52 |
| 156 | 121 |
| 157 | 58 |
| 158 | 118 |
| 159 | 137 |
| 160 | 114 |
| 161 | 97 |
| 162 | 19 |
| 163 | 155 |
| 164 | 67 |
| 165 | 25 |
| 166 | 17 |
| 167 | 126 |
| 168 | 23 |
| 169 | 43 |
| 170 | 27 |

TABLE 1-continued

| j-th block of Group-wise Interleaver output | π (j)-th block of Group-wise Interleaver input |
|---|---|
| 171 | 21 |
| 172 | 136 |
| 173 | 131 |
| 174 | 26 |
| 175 | 14 |
| 176 | 18 |
| 177 | 128 |
| 178 | 141 |
| 179 | 178. |

2. The transmission method according to claim 1, wherein the constellation points are defined by Table 2 which is associated with the code rate, and in the Table 2, the Address Label x indicates the index of the bit of the codeword and the PAM spots p(x) indicate a real value and an imaginary value of a constellation point, the PAM spots p(x) indicate an effective value of a PAM symbol corresponding to the Address Label x

TABLE 2

| Address Label x (integer, MSB first) | PAM spots p(x) | Address Label x (integer, MSB first) | PAM spots p(x) | Address Label x (integer, MSB first) | PAM spots p(x) | Address Label x (integer, MSB first) | PAM spots p(x) |
|---|---|---|---|---|---|---|---|
| 0 | 1.6851 | 16 | 0.081 | 32 | −1.6851 | 48 | −0.081 |
| 1 | 1.4381 | 17 | 0.0808 | 33 | −1.4381 | 49 | −0.0808 |
| 2 | 1.1766 | 18 | 0.081 | 34 | −1.1766 | 50 | −0.081 |
| 3 | 1.2355 | 19 | 0.0807 | 35 | −1.2355 | 51 | −0.0807 |
| 4 | 0.9162 | 20 | 0.1456 | 36 | −0.9162 | 52 | −0.1456 |
| 5 | 0.9089 | 21 | 0.1456 | 37 | −0.9089 | 53 | −0.1456 |
| 6 | 1.0012 | 22 | 0.1456 | 38 | −1.0012 | 54 | −0.1456 |
| 7 | 0.9771 | 23 | 0.1457 | 39 | −0.9771 | 55 | −0.1457 |
| 8 | 0.5684 | 24 | 0.4036 | 40 | −0.5684 | 56 | −0.4036 |
| 9 | 0.5681 | 25 | 0.4036 | 41 | −0.5681 | 57 | −0.4036 |
| 10 | 0.5704 | 26 | 0.4043 | 42 | −0.5704 | 58 | −0.4043 |
| 11 | 0.57 | 27 | 0.4042 | 43 | −0.57 | 59 | −0.4042 |
| 12 | 0.7385 | 28 | 0.3059 | 44 | −0.7385 | 60 | −0.3059 |
| 13 | 0.7425 | 29 | 0.306 | 45 | −0.7425 | 61 | −0.306 |
| 14 | 0.7155 | 30 | 0.3056 | 46 | −0.7155 | 62 | −0.3056 |
| 15 | 0.7186 | 31 | 0.3057 | 47 | −0.7186 | 63 | −0.3057. |

3. The transmission method according to claim 1, further comprising:

reordering the bits in the codeword with an M by Q matrix after the N cyclic blocks are reordered and before the bits in the codeword are mapped, M is a positive integer, wherein in the reordering of the bits, the bits are written into the M by Q matrix row-by-row and the written bits are read from the M by Q matrix column by column.

4. A reception method performed by a receiver, the reception method comprising:

receiving, by an antenna of the receiver, the transmission signal generated by the transmission method according to claim 1;

demapping, by a demapping circuit of the receiver, the mapped bits according to the non-uniform 4096 QAM scheme; and reversely reordering, by a deinterleaving circuit of the receiver, the N cyclic blocks according to the Table 1.

5. A reception device comprising:
a receiver configured to receive the transmission signal generated by the transmission method according to claim 1; and
a processor connected to the receiver, the processor being configured to perform:
  demapping the mapped bits according to the non-uniform 4096 QAM scheme; and
  reversely reordering the N cyclic blocks according to the Table 1.

* * * * *